(12) United States Patent
Gao et al.

(10) Patent No.: US 10,829,708 B2
(45) Date of Patent: *Nov. 10, 2020

(54) COMPOSITION AND METHOD FOR PREVENTING OR REDUCING ENGINE KNOCK AND PRE-IGNITION IN HIGH COMPRESSION SPARK IGNITION ENGINES

(71) Applicant: ExxonMobil Research and Engineering Company, Annandale, NJ (US)

(72) Inventors: Zhisheng Gao, Rose Valley, PA (US); Eugine Choi, Marlton, NJ (US); Luca Salvi, Haddonfield, NJ (US); Matthew W. Boland, Philadelphia, PA (US)

(73) Assignee: EXXONMOBIL RESEARCH AND ENGINEERING COMPANY, Annandale, NJ (US)

( * ) Notice: Subject to any disclaimer, the term of this patent is extended or adjusted under 35 U.S.C. 154(b) by 39 days.

This patent is subject to a terminal disclaimer.

(21) Appl. No.: 15/837,340

(22) Filed: Dec. 11, 2017

(65) Prior Publication Data

US 2018/0171253 A1 Jun. 21, 2018

Related U.S. Application Data

(60) Provisional application No. 62/435,902, filed on Dec. 19, 2016.

(51) Int. Cl.

| | | |
|---|---|---|
| *C10M 105/38* | (2006.01) | |
| *C10M 105/34* | (2006.01) | |
| *C10M 105/36* | (2006.01) | |
| *C10M 133/12* | (2006.01) | |
| *C10M 137/10* | (2006.01) | |
| *C10M 101/04* | (2006.01) | |
| *C10M 137/08* | (2006.01) | |
| *G01R 33/46* | (2006.01) | |
| *C10N 30/10* | (2006.01) | |
| *C10N 30/12* | (2006.01) | |
| *C10N 30/14* | (2006.01) | |
| *C10N 30/02* | (2006.01) | |
| *C10N 20/00* | (2006.01) | |
| *C10N 30/00* | (2006.01) | |
| *C10N 40/25* | (2006.01) | |

(52) U.S. Cl.
CPC ........ *C10M 105/34* (2013.01); *C10M 101/04* (2013.01); *C10M 105/36* (2013.01); *C10M 105/38* (2013.01); *C10M 133/12* (2013.01); *C10M 137/08* (2013.01); *C10M 137/10* (2013.01); *C10M 2207/2815* (2013.01); *C10M 2207/2825* (2013.01); *C10M 2207/2835* (2013.01); *C10M 2215/064* (2013.01); *C10M 2215/065* (2013.01); *C10M 2223/047* (2013.01); *C10N 2020/071* (2020.05); *C10N 2030/02* (2013.01); *C10N 2030/10* (2013.01); *C10N 2030/12* (2013.01); *C10N 2030/14* (2013.01); *C10N 2030/45* (2020.05); *C10N 2040/25* (2013.01); *G01R 33/46* (2013.01)

(58) Field of Classification Search
CPC .................................................... C10M 105/38
USPC .......................................................... 508/485
See application file for complete search history.

(56) References Cited

U.S. PATENT DOCUMENTS

| | | | |
|---|---|---|---|
| 1,815,022 | A | 7/1931 | Davis |
| 2,015,748 | A | 10/1935 | Frolich |

(Continued)

FOREIGN PATENT DOCUMENTS

| | | |
|---|---|---|
| CA | 1094044 A | 1/1981 |
| EP | 464546 B1 | 7/1995 |

(Continued)

OTHER PUBLICATIONS

The International Search Report and Written Opinion of PCT/US2017/065551 dated Mar. 5, 2018.

(Continued)

*Primary Examiner* — Ellen M McAvoy
(74) *Attorney, Agent, or Firm* — Anthony G. Boone; Robert A. Migliorini

(57) ABSTRACT

A method for preventing or reducing engine knock or pre-ignition in a high compression spark ignition engine with relatively high oil consumption, lubricated with a lubricating oil by using as the lubricating oil a formulated oil. The formulated oil has a composition that contains a lubricating oil base stock comprising at least one ester including at least one group selected from the group consisting of Formula (1), Formula (2), Formula (3) and Formula (4) below or at least one ester having at least 25% of its carbons in the form of methyl groups:

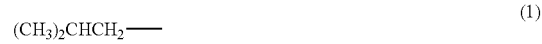

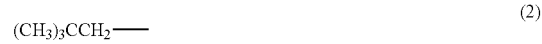

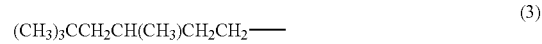

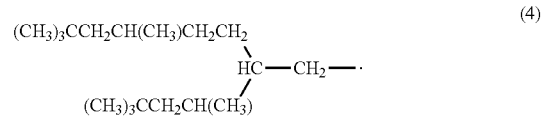

The lubricating oils of this disclosure are useful as passenger vehicle engine oil (PVEO) products.

39 Claims, 1 Drawing Sheet

(56) References Cited

U.S. PATENT DOCUMENTS

| | | |
|---|---|---|
| 2,100,993 A | 11/1937 | Bruson |
| 2,191,498 A | 2/1940 | Reiff |
| 2,387,501 A | 10/1945 | Dietrich |
| 2,655,479 A | 10/1953 | Munday et al. |
| 2,666,746 A | 1/1954 | Munday et al. |
| 2,721,877 A | 10/1955 | Popkin et al. |
| 2,721,878 A | 10/1955 | Popkin |
| 2,817,693 A | 12/1957 | Koome et al. |
| 3,036,003 A | 5/1962 | Verdol |
| 3,087,936 A | 4/1963 | Le Suer |
| 3,172,892 A | 3/1965 | Le Suer et al. |
| 3,200,107 A | 8/1965 | Le Suer |
| 3,215,707 A | 11/1965 | Rense |
| 3,219,666 A | 11/1965 | Norman et al. |
| 3,250,715 A | 5/1966 | Wyman |
| 3,254,025 A | 5/1966 | Le Suer |
| 3,272,746 A | 9/1966 | Le Suer et al. |
| 3,275,554 A | 9/1966 | Wagenaar |
| 3,316,177 A | 4/1967 | Dorer, Jr. |
| 3,322,670 A | 5/1967 | Hammond et al. |
| 3,329,658 A | 7/1967 | Fields |
| 3,341,542 A | 9/1967 | Le Suer et al. |
| 3,382,291 A | 5/1968 | Brennan |
| 3,413,347 A | 11/1968 | Worrel |
| 3,438,757 A | 4/1969 | Honnen et al. |
| 3,444,170 A | 5/1969 | Norman et al. |
| 3,449,250 A | 6/1969 | Fields |
| 3,454,555 A | 7/1969 | van der Voort et al. |
| 3,454,607 A | 7/1969 | Le Suer et al. |
| 3,519,565 A | 7/1970 | Coleman |
| 3,541,012 A | 11/1970 | Stuebe |
| 3,565,804 A | 2/1971 | Honnen et al. |
| 3,576,923 A | 4/1971 | Randell et al. |
| 3,595,791 A | 7/1971 | Cohen |
| 3,630,904 A | 12/1971 | Musser et al. |
| 3,632,511 A | 1/1972 | Liao |
| 3,652,616 A | 3/1972 | Watson et al. |
| 3,666,730 A | 5/1972 | Coleman |
| 3,687,849 A | 8/1972 | Abbott |
| 3,697,574 A | 10/1972 | Piasek et al. |
| 3,702,300 A | 11/1972 | Coleman |
| 3,703,536 A | 11/1972 | Piasek et al. |
| 3,704,308 A | 11/1972 | Piasek et al. |
| 3,725,277 A | 4/1973 | Worrel |
| 3,725,480 A | 4/1973 | Traise et al. |
| 3,726,882 A | 4/1973 | Traise et al. |
| 3,742,082 A | 6/1973 | Brennan |
| 3,751,365 A | 8/1973 | Piasek et al. |
| 3,755,433 A | 8/1973 | Miller et al. |
| 3,756,953 A | 9/1973 | Piasek et al. |
| 3,769,363 A | 10/1973 | Brennan |
| 3,787,374 A | 1/1974 | Adams |
| 3,798,165 A | 3/1974 | Piasek et al. |
| 3,803,039 A | 4/1974 | Piasek et al. |
| 3,822,209 A | 7/1974 | Knapp et al. |
| 3,876,720 A | 4/1975 | Heilman et al. |
| 3,948,800 A | 4/1976 | Meinhardt |
| 4,100,082 A | 7/1978 | Clason et al. |
| 4,149,178 A | 4/1979 | Estes |
| 4,218,330 A | 8/1980 | Shubkin |
| 4,234,435 A | 11/1980 | Meinhardt et al. |
| 4,239,930 A | 12/1980 | Allphin et al. |
| 4,367,352 A | 1/1983 | Watts, Jr. et al. |
| 4,413,156 A | 11/1983 | Watts, Jr. et al. |
| 4,426,305 A | 1/1984 | Malec |
| 4,434,408 A | 2/1984 | Baba et al. |
| 4,454,059 A | 6/1984 | Pindar et al. |
| 4,594,172 A | 6/1986 | Sie |
| 4,752,416 A | 6/1988 | Scharf et al. |
| 4,767,551 A | 8/1988 | Hunt et al. |
| 4,798,684 A | 1/1989 | Salomon |
| 4,826,633 A | 5/1989 | Carr et al. |
| 4,827,064 A | 5/1989 | Wu |
| 4,827,073 A | 5/1989 | Wu |
| 4,897,178 A | 1/1990 | Best et al. |
| 4,910,355 A | 3/1990 | Shubkin et al. |
| 4,921,594 A | 5/1990 | Miller |
| 4,943,672 A | 7/1990 | Hamner |
| 4,956,122 A | 9/1990 | Watts et al. |
| 4,975,177 A | 12/1990 | Garwood et al. |
| 5,068,487 A | 11/1991 | Theriot |
| 5,075,269 A | 12/1991 | Degnan et al. |
| 5,084,197 A | 1/1992 | Galic et al. |
| 5,705,458 A | 1/1998 | Roby et al. |
| 6,034,039 A | 3/2000 | Gomes et al. |
| 6,080,301 A | 6/2000 | Berlowitz et al. |
| 6,090,989 A | 7/2000 | Trewella et al. |
| 6,165,949 A | 12/2000 | Berlowitz et al. |
| 6,323,164 B1 | 11/2001 | Liesen et al. |
| 6,436,881 B1 | 8/2002 | McHenry et al. |
| 7,704,930 B2 | 4/2010 | Deckman et al. |
| 8,048,833 B2 | 11/2011 | Habeeb et al. |
| 8,129,320 B2 | 3/2012 | Amann et al. |
| 8,492,321 B2 | 7/2013 | Goujon et al. |
| 9,896,634 B2 | 2/2018 | Gao et al. |
| 9,944,877 B2* | 4/2018 | Gao ................... C10M 105/38 |
| 10,119,090 B2* | 11/2018 | Gao ................... C10M 105/24 |
| 2007/0179069 A1 | 8/2007 | Burgo et al. |
| 2012/0322987 A1 | 12/2012 | Jang et al. |
| 2013/0035268 A1 | 2/2013 | Zehler |
| 2013/0131373 A1* | 5/2013 | Inayama ................ C07C 67/08 560/129 |
| 2013/0131374 A1* | 5/2013 | Inayama ................ C07C 67/08 560/190 |
| 2013/0231498 A1* | 9/2013 | Inayama ................ C07C 67/08 560/190 |
| 2015/0001438 A1* | 1/2015 | Kishi .................... C09K 5/041 252/68 |
| 2015/0322368 A1* | 11/2015 | Patel ................... C10M 163/00 508/192 |
| 2015/0322369 A1* | 11/2015 | Patel ................... C10M 163/00 508/162 |
| 2015/0322372 A1 | 11/2015 | Gao et al. |
| 2016/0016879 A1* | 1/2016 | Bertin .................. C07C 69/533 554/223 |
| 2016/0053194 A1* | 2/2016 | Beyer ................. C10M 105/38 508/492 |
| 2016/0272915 A1* | 9/2016 | Mosier ................ C10M 159/20 |
| 2016/0311751 A1* | 10/2016 | Nakayama ............. C07C 69/33 |
| 2017/0009169 A1 | 1/2017 | Gao et al. |
| 2017/0022441 A1 | 1/2017 | Onodera et al. |
| 2017/0369808 A1* | 12/2017 | Kusuhara ............. C10M 125/22 |
| 2018/0044606 A1* | 2/2018 | Aoki ................... C10M 169/04 |
| 2019/0048282 A1* | 2/2019 | Gieselman ........... C10M 125/10 |

FOREIGN PATENT DOCUMENTS

| | | |
|---|---|---|
| EP | 471071 B1 | 8/1995 |
| EP | 464547 B1 | 5/1998 |
| GB | 1390359 A | 5/1971 |
| GB | 1350257 A | 4/1974 |
| GB | 1429494 A | 3/1976 |
| GB | 1440230 A | 6/1976 |

OTHER PUBLICATIONS

Marciante et al., "The Influence of Lubricating Oil Ash on Surface Ignition Phenomena", SAE Technical Paper 700548, 1970.

Takeuchi et al., "Investigation of Engine Oil Effect on Abnormal Combustion in Turbocharged Direct Injection-Spark Ignition Engines", SAE International Journal of Fuels and Lubricants, 2012, vol. 5, pp. 1017-1024.

Marciante et al., "The Influence of Lubricating Oil Ash on the ORI of Engines Running on Unleaded Fuel", SAE Technical Paper, 720945, 1972.

Morikawa et al., "Investigation of Lubricating Oil Properties Effect on Low Speed Pre-Ignition", SAE Technical Paper 2015-01-1870, 2015.

Moriyoshi et al., "A Study of Low Speed Preignition Mechanism in Highly Boosted SI Gasoline Engines", SAE Technical Paper, 2015-01-1865, 2015.

(56) References Cited

OTHER PUBLICATIONS

Onodera et al., "Engine Oil Formulation Technology to Prevent Pre-ignition in Turbocharged Direct Injection Spark Ignition Engines", SAE Technical Paper 2015-01-2027, 2015.
API 1509 Documents, Aug. 9, 2018, https://www.api.org/products-and-services/engine-oil/documents/api-1509-documents.
"Ethylene Amines", Encyclopedia of Chemical Technology, 2nd ed, vol. 7, pp. 22-37 (Need to Clean This Up).

* cited by examiner

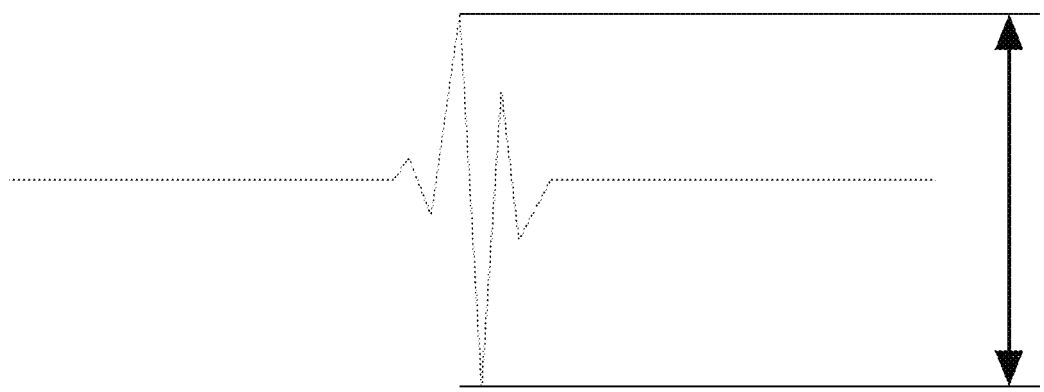

COMPOSITION AND METHOD FOR PREVENTING OR REDUCING ENGINE KNOCK AND PRE-IGNITION IN HIGH COMPRESSION SPARK IGNITION ENGINES

CROSS-REFERENCE TO RELATED APPLICATIONS

This application claims priority to U.S. Provisional Application Ser. No. 62/435,902 filed Dec. 19, 2016, which is herein incorporated by reference in its entirety.

FIELD

This disclosure relates to a lubricant composition for high compression spark ignition engines with relatively high oil consumption that contains a lubricating oil base stock comprising at least one ester containing at least one of the following groups of Formula (1), Formula (2), Formula (3), and Formula (4) below or at least one ester having at least 25% of its carbons in the form of methyl groups:

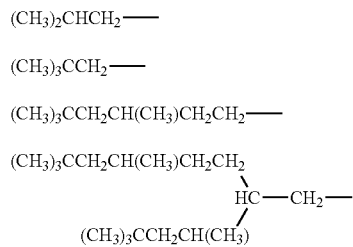

This disclosure also relates to a method for preventing or reducing engine knock and pre-ignition, especially low speed pre ignition or LSPI, in an engine lubricated with a formulated oil. The formulated oil has a composition comprising a lubricating oil base stock comprising at least one ester containing at least one of the groups of Formula (1), Formula (2), Formula (3) and Formula (4) or at least one ester having at least 25% of its carbons in the form of methyl groups. The lubricating oils of this disclosure are useful as passenger vehicle engine oil (PVEO) products.

BACKGROUND

In a 4-stroke cycle gasoline engine, the combustion process is, by design, initiated by the spark-plug at the right crank angle, leading to optimum energy output. If the fuel-air mixture ignites under compression, either prior to the spark or in the unburned fuel-air mixture being heated and compressed by the propagating flame, abnormal combustion may occur. Examples of this are engine knock (detonation after the spark) or pre-ignition. These undesirable events may result in engine damage.

The resistance to abnormal combustion events of a fuel is rated on one of several octane scales, such as the Research Octane Number (RON), Motor Octane Number (MON), or the Supercharged Rich Octane method. Higher octane numbers indicate a resistance to combustion, and are associated with in increased ignition delay. Generally, aromatics, naphthenes, alkenes, and branched alkane molecules increase the octane number of a fuel, while linear paraffins decrease the octane number of a fuel. However, most of the existing data are limited to low molecular weight molecules, generally with carbon numbers 20 or below.

Oxygenate additives such as methanol, ethanol, and MTBE are known to increase octane number. However, there are performance concerns associated with methanol (e.g., corrosion) and ethanol (e.g., elastomer compatibility), and environmental concerns associated with MTBE. In addition, these oxygenates are not suitable for use in a lubricant composition.

Today's high performance engines are trending toward higher compression ratios (11 or higher), in order to generate higher power at a given engine displacement. As the compression ratio increases, the fuel-air mixture has a higher propensity to ignite by compression, resulting in detonation of the unburned end gases (knocking) or pre-ignition.

Traditional spark knocking can be controlled by retarding spark timing or by reducing the super- or turbo-charger boost pressure. Hot-spot pre-ignition is prevented by engine hardware design and limiting the temperatures in the combustion chamber. However, these measures also reduce the efficiency of the engine. An approach preferred by engine manufacturers is to use fuels that are less likely to be ignited by compression.

Engine oils usually contain 80-90% of hydrocarbon base oils. These hydrocarbons include long linear hydrocarbons and ignite easily under compression. During normal engine operation, some of the engine oil exists in the combustion chamber, leading to the concern that engine oil contributes to engine knocking and pre-ignition.

Under high brake mean effective pressure (BMEP) and low engine speed (RPM), some modern internal engines experience an abnormal combustion phenomenon called low speed pre-ignition (LSPI) or "super knock". It is known that LSPI can lead to severe engine damage.

In gasoline engines, studies have found that surface ignition is associated with deposits from the metallic lubricant additives. See for example, Marciante, A. and Chiampo, P., "Influence of Lubricating Oil Ash on the ORI of Engines Running on Unleaded Fuel," SAE Technical Paper 720945, 1972, doi:10.4271/720945; and Marciante, A. and Chiampo, P., "The Influence of Lubricating Oil Ash on Surface Ignition Phenomena," SAE Technical Paper 700458, 1970, doi:10.4271/700458. It is also known that engine pre-ignition and engine knock in natural gas engines are associated with ash deposits (Infineum Insight, June 2013).

Although engine knocking and pre-ignition problems can be and are being resolved by optimization of internal engine components and by the use of new component technology such as electronic controls and knock sensors, modification of the lubricating oil compositions used to lubricate such engines would be desirable. For example, it would be desirable to develop new lubricating oil formulations having a base oil with lower propensity to knock and pre-ignition and ashless additives which are particularly useful in high compression spark ignition internal combustion engines and, when used in these internal combustion engines, will prevent or minimize the engine knocking and pre-ignition problems. It is desired that the lubricating oil composition having a base oil with lower propensity to knock and pre-ignition and ashless additives be useful in lubricating gasoline-fueled, and natural gas, liquefied petroleum gas, dimethyl ether-fueled spark ignition engines, or any spark ignition engine operating under a fuel from a renewable source (e.g., ethanol).

The presence of calcium in engine lubricant has been found to increase LSPI events (e.g., Takeuchi, K. SAE 2012-01-1615) and molybdenum, zinc, and boron have been shown to reduce LSPI (e.g., Takeuchi, K. in SAE 2012-01-1615; Ko, O. et al. in PCT Publication No. WO2015114920 and SAE 2015-01-2027, Patel, M. et al. in U.S. Patent Publication No. 2015322368).

In PCT Publication No. WO2015114920, Ko et al. defined a criterion for low LSPI oil by the following equation:

$$([Ca]+0.5[Mg])\times 8-[Mo]\times 8-[P]\times 30 \quad \text{(Equation 1)}$$

where [Element] is the concentration of the element in the unit of Mass %. X less or equal to −0.85 is required for low LSPI. However, this observation may not be applicable to the operating conditions where the lubricant oil consumption is relatively high.

In a modern engine, oil consumption or lubricating engine oil consumption is determined by many factors, including engine configuration and piston ring tension. In addition, engine operating conditions, such as acceleration, could also affect oil consumption. Furthermore, lubricating engine oil formulation, such as oil viscosity and base oil volatility, could also have a significant impact on oil consumption. After an engine is in operation for a period of time, engine wear and deposits could also affect oil consumption. When the oil consumption is high, in many cases more oil is involved in the combustion process. Therefore, the impact of a lubricating engine oil on LSPI would become more significant, requiring a different approach in engine oil formulation.

SUMMARY

This disclosure relates in part to new lubricating oil formulations which are particularly useful in high compression spark ignition engines and, when used in high compression spark ignition engines with relatively high oil consumption, will prevent or minimize engine knocking and pre-ignition problems. The lubricating oil compositions of this disclosure are useful in high compression spark ignition engines, including gasoline-fueled, and natural gas, liquefied petroleum gas, dimethyl ether-fueled spark ignition engines, or any spark ignition engine operating under a fuel from a renewable source (e.g., ethanol). The lubricant formulation chemistry of this disclosure can be used to prevent or control the detrimental effect of engine knocking and pre-ignition in engines which have already been designed or sold in the marketplace as well as future engine technology. The lubricant formulation solutions afforded by this disclosure for preventing or reducing engine knocking and pre-ignition problems enables product differentiation with regard to the engine knocking and pre-ignition problems.

This disclosure also relates in part to a method for preventing or reducing engine knock or pre-ignition, including LSPI, in a high compression spark ignition engine lubricated with a lubricating oil by using as the lubricating oil a formulated oil. The formulated oil has a composition comprising a lubricating oil base stock as a major component comprising at least one ester having at least one of the groups selected from the group consisting of Formula (1), Formula (2), Formula (3), and Formula (4) or at least one ester having at least 25% of its carbons in the form of methyl groups.

(1)

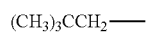
(2)

(3)

(4)

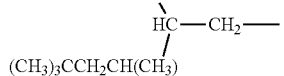

This disclosure also relates in part to a lubricating engine oil for high compression spark ignition engines. The lubricating engine oil has a composition comprising a lubricating oil base stock comprising at least one ester having at least one of the groups selected from the group consisting of Formula (1), Formula (2), Formula (3) and Formula (4) or at least one ester having at least 25% of its carbons in the form of methyl groups.

This disclosure further relates in part to a lubricating engine oil for high compression spark ignition engines. The lubricating engine oil has a composition comprising (i) a lubricating oil base stock comprising at least one ester having at least one of the groups selected from the group consisting of Formula (1), and Formula (2), Formula (3), and Formula (4) or at least one ester having at least 25% of its carbons in the form of methyl groups and (ii) at least one ashless antiwear additive selected from a phosphorus-containing ashless antiwear additive, a sulfur-containing ashless antiwear additive, and a phosphorus/sulfur-containing ashless antiwear additive.

This disclosure also relates in part to a high compression spark ignition engine lubricated with the lubricating engine oil. The lubricating engine oil has a composition that comprises a lubricating oil base stock comprising at least one ester having at least one of the groups selected from the group consisting of Formula (1), Formula (2), Formula (3) and Formula (4) or at least one ester having at least 25% of its carbons in the form of methyl groups.

The disclosure yet further relates in part to a method of making a lubricating engine oil for high compression spark ignition engines. The method comprises blending a lubricating oil base stock comprising at least one ester having at least one of the following groups of Formula (1), Formula (2), Formula (3), and Formula (4) or at least one ester having at least 25% of its carbons in the form of methyl groups, with at least one antiwear additive selected from the group consisting of a phosphorus-containing ashless antiwear additive, a sulfur-containing ashless antiwear additive, a phosphorus/sulfur-containing ashless antiwear additive, and a zinc dialkyldithiophosphate additive.

It has been surprisingly found that, in accordance with this disclosure, prevention or reduction of engine knocking and pre-ignition, including LSPI, problems in a high compression spark ignition engine with relatively high oil consumption cannot be attained by using as the lubricating oil a formulated oil according to Equation (1) above, but can be attained in an engine by using as the lubricating oil a formulated oil comprising (i) a lubricating oil base stock comprising at least one ester having at least one of the groups selected from the group consisting of Formula (1), Formula (2), Formula (3), and Formula (4) or at least one ester having at least 25% of its carbons in the form of methyl groups The preferred ester is a monoester, diester, or polyol ester having at least one of the groups selected from the group consisting of Formula (1), Formula (2), Formula (3), and Formula (4) or at least one ester having at least 25% of its carbons in the form of methyl groups Preferably all the alkyl groups in these esters are selected from the group consisting of these formulas.

Other objects and advantages of the present disclosure will become apparent from the detailed description that follows.

BRIEF DESCRIPTION OF THE DRAWINGS

FIG. 1 is a schematic illustration of the Knock peak to peak, defined as the maximum amplitude of the band-pass filtered pressure signal.

DETAILED DESCRIPTION

All numerical values within the detailed description and the claims herein are modified by "about" or "approximately" the indicated value, and take into account experimental error and variations that would be expected by a person having ordinary skill in the art.

It has now been found that the lubricating oil formulations of this disclosure, which are particularly useful in high compression spark ignition internal combustion engines and, when used in the high compression spark ignition internal combustion engines with relatively high oil consumption, will prevent or minimize engine knocking and pre-ignition problems, including LSPI. Prevention or reduction of engine knocking and/or pre-ignition problems can be attained in an engine lubricated with a lubricating oil by using as the lubricating oil a formulated oil that has (i) a lubricating oil base stock comprising at least one ester having at least one of the groups selected from the group consisting of Formula (1), Formula (2), Formula (3) and Formula (4) or at least one ester having at least 25% of its carbons in the form of methyl groups, and (ii) at least one antiwear additive selected from a phosphorus-containing ashless antiwear additive, a sulfur-containing ashless antiwear additive, a phosphorus/sulfur-containing ashless antiwear additive and a zinc dialkyldithiophosphate (ZDDP). The preferred branched ester is a monoester, diester, or polyol ester having at least one of the groups selected from the group consisting of Formula (1), Formula (2), Formula (3), and Formula 4 or at least one ester having at least 25% of its carbons in the form of methyl groups. Preferably all the alkyl groups in these esters are selected from the group consisting of these formulas. The preferred antiwear additive comprises an amine phosphate, a thiophosphate, a dithiophosphate, an amine salt of sulfurized phosphate, an alkylated triphenylphosphorothionate, a zinc dialkyldithiophosphate (ZDDP), or mixtures thereof. The other preferred additives in the lubricating oil formulation includes a polymeric aminic antioxidant and an ashless detergent such as oil-soluble nonionic detergent.

 (1)

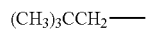 (2)

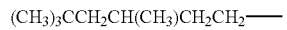 (3)

 (4)

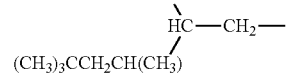

The lubricating oils of this disclosure are particularly useful in high compression spark ignition internal combustion engines and, when used in high compression spark ignition internal combustion engines with relatively high oil consumption, will prevent or minimize engine knocking and pre-ignition problems, including LSPI. The lubricating oil compositions of this disclosure are useful in lubricating high compression spark ignition engines.

As indicated herein, the lubricating oil formulations of this disclosure are particularly useful in high compression spark ignition engines and, when used in the high compression spark ignition engines with relatively high oil consumption, will prevent or minimize engine knocking and pre-ignition problems, including LSPI. The high compression spark ignition engines include, for example, super-charged engines and turbo-charged engines. The high compression spark ignition engines have a compression ratio of at least about 11, preferably at least about 13, and more preferably at least about 15. The relatively high oil consumption include, for example, higher than about 50 grams per hour, higher than about 100 grams per hour, or higher than about 150 grams per hour.

As used herein, the term "iso" refers to any single isomer or a mixture of isomers. For example, isoeicosane refers to a mixture of highly branched hydrocarbons with average molecular weight close to isoeicosane, and not just to 2-methyl nonadecane.

Lubricating Oil Base Stocks

A wide range of lubricating base oils is known in the art. Lubricating base oils that are useful in the present disclosure are both natural oils, and synthetic oils, and unconventional oils (or mixtures thereof) can be used unrefined, refined, or rerefined (the latter is also known as reclaimed or reprocessed oil). Unrefined oils are those obtained directly from a natural or synthetic source and used without added purification. These include shale oil obtained directly from retorting operations, petroleum oil obtained directly from primary distillation, and ester oil obtained directly from an esterification process. Refined oils are similar to the oils discussed for unrefined oils except refined oils are subjected to one or more purification steps to improve at least one lubricating oil property. One skilled in the art is familiar with many purification processes. These processes include solvent extraction, secondary distillation, acid extraction, base extraction, filtration, and percolation. Rerefined oils are obtained by processes analogous to refined oils but using an oil that has been previously used as a feed stock.

Groups I, II, III, IV and V are broad base oil stock categories developed and defined by the American Petroleum Institute (API Publication 1509; www.API.org) to create guidelines for lubricant base oils. Group I base stocks have a viscosity index of between about 80 to 120 and contain greater than about 0.03% sulfur and/or less than about 90% saturates. Group II base stocks have a viscosity index of between about 80 to 120, and contain less than or equal to about 0.03% sulfur and greater than or equal to about 90% saturates. Group III stocks have a viscosity index greater than about 120 and contain less than or equal to about 0.03% sulfur and greater than about 90% saturates. Group IV includes polyalphaolefins (PAO). Group V base stock includes base stocks not included in Groups I-IV. The table below summarizes properties of each of these five groups.

| | Base Oil Properties | | |
|---|---|---|---|
| | Saturates | Sulfur | Viscosity Index |
| Group I | <90 and/or | >0.03% and | ≥80 and <120 |
| Group II | ≥90 and | ≤0.03% and | ≥80 and <120 |
| Group III | ≥90 and | ≤0.03% and | ≥120 |
| Group IV | Polyalphaolefins (PAO) | | |
| Group V | All other base oil stocks not included in Groups I, II, III or IV | | |

Natural oils include animal oils, vegetable oils (castor oil and lard oil, for example), and mineral oils. Animal and vegetable oils possessing favorable thermal oxidative stability can be used. Of the natural oils, mineral oils are preferred. Mineral oils vary widely as to their crude source, for example, as to whether they are paraffinic, naphthenic, or mixed paraffinic-naphthenic. Oils derived from coal or shale are also useful. Natural oils vary also as to the method used for their production and purification, for example, their distillation range and whether they are straight run or cracked, hydrorefined, or solvent extracted.

Group II and/or Group III hydroprocessed or hydrocracked base stocks, including synthetic oils such as polyalphaolefins, alkyl aromatics and synthetic esters are also well known base stock oils.

Synthetic oils include hydrocarbon oil. Hydrocarbon oils include oils such as polymerized and interpolymerized olefins (polybutylenes, polypropylenes, propylene isobutylene copolymers, ethylene-olefin copolymers, and ethylene-alphaolefin copolymers, for example). Polyalphaolefin (PAO) oil base stocks are commonly used synthetic hydrocarbon oil. By way of example, PAOs derived from $C_8$, $C_{10}$, $C_{12}$, $C_{14}$ olefins or mixtures thereof may be utilized. See U.S. Pat. Nos. 4,956,122; 4,827,064; and 4,827,073.

The number average molecular weights of the PAOs, which are known materials and generally available on a major commercial scale from suppliers such as ExxonMobil Chemical Company, Chevron Phillips Chemical Company, BP, and others, typically vary from about 250 to about 3,000, although PAO's may be made in viscosities up to about 150 cSt (100° C.). The PAOs are typically comprised of relatively low molecular weight hydrogenated polymers or oligomers of alphaolefins which include, but are not limited to, $C_2$ to about $C_{32}$ alphaolefins with the $C_8$ to about $C_{16}$ alphaolefins, such as 1-hexene, 1-octene, 1-decene, 1-dodecene and the like, being preferred. The preferred polyalphaolefins are poly-1-hexene, poly-1-octene, poly-1-decene and poly-1-dodecene and mixtures thereof and mixed olefin-derived polyolefins. However, the dimers of higher olefins in the range of $C_{14}$ to $C_{18}$ may be used to provide low viscosity base stocks of acceptably low volatility. Depending on the viscosity grade and the starting oligomer, the PAOs may be predominantly trimers and tetramers of the starting olefins, with minor amounts of the higher oligomers, having a viscosity range of 1.5 to 12 cSt. PAO fluids of particular use may include 3.0 cSt, 3.4 cSt, and/or 3.6 cSt and combinations thereof. Bi-modal mixtures of PAO fluids having a viscosity range of 1.5 to 150 cSt may be used if desired.

The PAO fluids may be conveniently made by the polymerization of an alphaolefin in the presence of a polymerization catalyst such as the Friedel-Crafts catalysts including, for example, aluminum trichloride, boron trifluoride or complexes of boron trifluoride with water, alcohols such as ethanol, propanol or butanol, carboxylic acids or esters such as ethyl acetate or ethyl propionate. For example the methods disclosed by U.S. Pat. No. 4,149,178 or 3,382,291 may be conveniently used herein. Other descriptions of PAO synthesis are found in the following U.S. Pat. Nos. 3,742,082; 3,769,363; 3,876,720; 4,239,930; 4,367,352; 4,413,156; 4,434,408; 4,910,355; 4,956,122; and 5,068,487. The dimers of the $C_{14}$ to $C_{18}$ olefins are described in U.S. Pat. No. 4,218,330.

Other useful lubricant oil base stocks include wax isomerate base stocks and base oils, comprising hydroisomerized waxy stocks (e.g. waxy stocks such as gas oils, slack waxes, fuels hydrocracker bottoms, etc.), hydroisomerized Fischer-Tropsch waxes, Gas-to-Liquids (GTL) base stocks and base oils, and other wax isomerate hydroisomerized base stocks and base oils, or mixtures thereof Fischer-Tropsch waxes, the high boiling point residues of Fischer-Tropsch synthesis, are highly paraffinic hydrocarbons with very low sulfur content. The hydroprocessing used for the production of such base stocks may use an amorphous hydrocracking/hydroisomerization catalyst, such as one of the specialized lube hydrocracking (LHDC) catalysts or a crystalline hydrocracking/hydroisomerization catalyst, preferably a zeolitic catalyst. For example, one useful catalyst is ZSM-48 as described in U.S. Pat. No. 5,075,269, the disclosure of which is incorporated herein by reference in its entirety. Processes for making hydrocracked/hydroisomerized distillates and hydrocracked/hydroisomerized waxes are described, for example, in U.S. Pat. Nos. 2,817,693; 4,975,177; 4,921,594 and 4,897,178 as well as in British Patent Nos. 1,429,494; 1,350,257; 1,440,230 and 1,390,359. Each of the aforementioned patents is incorporated herein in their entirety. Particularly favorable processes are described in European Patent Application Nos. 464546 and 464547, also incorporated herein by reference. Processes using Fischer-Tropsch wax feeds are described in U.S. Pat. Nos. 4,594,172 and 4,943,672, the disclosures of which are incorporated herein by reference in their entirety.

Gas-to-Liquids (GTL) base oils, Fischer-Tropsch wax derived base oils, and other wax-derived hydroisomerized (wax isomerate) base oils be advantageously used in the instant disclosure, and may have useful kinematic viscosities at 100° C. of about 3 cSt to about 50 cSt, preferably about 3 cSt to about 30 cSt, more preferably about 3.5 cSt to about 25 cSt, as exemplified by GTL 4 with kinematic viscosity of about 4.0 cSt at 100° C. and a viscosity index of about 141. These Gas-to-Liquids (GTL) base oils, Fischer-Tropsch wax derived base oils, and other wax-derived hydroisomerized base oils may have useful pour points of about −20° C. or lower, and under some conditions may have advantageous pour points of about −25° C. or lower, with useful pour points of about −30° C. to about −40° C. or lower. Useful compositions of Gas-to-Liquids (GTL) base oils, Fischer-Tropsch wax derived base oils, and wax-derived hydroisomerized base oils are recited in U.S. Pat. Nos. 6,080,301; 6,090,989, and 6,165,949 for example, and are incorporated herein in their entirety by reference.

The hydrocarbyl aromatics can be used as base oil or base oil component and can be any hydrocarbyl molecule that contains at least about 5% of its weight derived from an aromatic moiety such as a benzenoid moiety or naphthenoid moiety, or their derivatives. These hydrocarbyl aromatics include alkyl benzenes, alkyl naphthalenes, alkyl diphenyl oxides, alkyl naphthols, alkyl diphenyl sulfides, alkylated bis-phenol A, alkylated thiodiphenol, and the like. The aromatic can be mono-alkylated, dialkylated, polyalkylated, and the like. The aromatic can be mono- or poly-functionalized. The hydrocarbyl groups can also be comprised of mixtures of alkyl groups, alkenyl groups, alkynyl, cycloalkyl groups, cycloalkenyl groups and other related hydrocarbyl groups. The hydrocarbyl groups can range from about $C_6$ up to about $C_{60}$ with a range of about $C_8$ to about $C_{20}$ often being preferred. A mixture of hydrocarbyl groups is often preferred, and up to about three such substituents may be present. The hydrocarbyl group can optionally contain sulfur, oxygen, and/or nitrogen containing substituents. The aromatic group can also be derived from natural (petroleum) sources, provided at least about 5% of the molecule is comprised of an above-type aromatic moiety. Viscosities at 100° C. of approximately 3 cSt to about 50 cSt are preferred, with viscosities of approximately 3.4 cSt to about 20 cSt often being more preferred for the hydrocarbyl aromatic component. In one embodiment, an alkyl naphthalene where the alkyl group is primarily comprised of 1-hexadecene is used. Other alkylates of aromatics can be advantageously used. Naphthalene or methyl naphthalene, for example, can be alkylated with olefins such as octene, decene, dodecene, tetradecene or higher, mixtures of similar olefins, and the like. Useful concentrations of hydrocarbyl aromatic in a lubricant oil composition can be about 2% to about 25%, preferably about 4% to about 20%, and more preferably about 4% to about 15%, depending on the application.

Alkylated aromatics such as the hydrocarbyl aromatics of the present disclosure may be produced by well-known Friedel-Crafts alkylation of aromatic compounds. See Friedel-Crafts and Related Reactions, Olah, G. A. (ed.), Inter-science Publishers, New York, 1963. For example, an aromatic compound, such as benzene or naphthalene, is alkylated by an olefin, alkyl halide or alcohol in the presence of a Friedel-Crafts catalyst. See Friedel-Crafts and Related Reactions, Vol. 2, part 1, chapters 14, 17, and 18, See Olah, G. A. (ed.), Inter-science Publishers, New York, 1964. Many homogeneous or heterogeneous, solid catalysts are known to one skilled in the art. The choice of catalyst depends on the reactivity of the starting materials and product quality requirements. For example, strong acids such as $AlCl_3$, $BF_3$, or HF may be used. In some cases, milder catalysts such as $FeCl_3$ or $SnCl_4$ are preferred. Newer alkylation technology uses zeolites or solid super acids.

Other useful fluids of lubricating viscosity include non-conventional or unconventional base stocks that have been processed, preferably catalytically, or synthesized to provide high performance lubrication characteristics.

Non-conventional or unconventional base stocks/base oils include one or more of a mixture of base stock(s) derived from one or more Gas-to-Liquids (GTL) materials, as well as isomerate/isodewaxate base stock(s) derived from natural wax or waxy feeds, mineral and or non-mineral oil waxy feed stocks such as slack waxes, natural waxes, and waxy stocks such as gas oils, waxy fuels hydrocracker bottoms, waxy raffinate, hydrocrackate, thermal crackates, or other mineral, mineral oil, or even non-petroleum oil derived waxy materials such as waxy materials received from coal liquefaction or shale oil, and mixtures of such base stocks.

GTL materials are materials that are derived via one or more synthesis, combination, transformation, rearrangement, and/or degradation/deconstructive processes from gaseous carbon-containing compounds, hydrogen-containing compounds and/or elements as feed stocks such as hydrogen, carbon dioxide, carbon monoxide, water, methane, ethane, ethylene, acetylene, propane, propylene, propyne, butane, butylenes, and butynes. GTL base stocks and/or base oils are GTL materials of lubricating viscosity that are generally derived from hydrocarbons; for example, waxy synthesized hydrocarbons, that are themselves derived from simpler gaseous carbon-containing compounds, hydrogen-containing compounds and/or elements as feed stocks. GTL base stock(s) and/or base oil(s) include oils boiling in the lube oil boiling range (1) separated/fractionated from synthesized GTL materials such as, for example, by distillation and subsequently subjected to a final wax processing step which involves either or both of a catalytic dewaxing process, or a solvent dewaxing process, to produce lube oils of reduced/low pour point; (2) synthesized wax isomerates, comprising, for example, hydrodewaxed or hydroisomerized cat and/or solvent dewaxed synthesized wax or waxy hydrocarbons; (3) hydrodewaxed or hydroisomerized cat and/or solvent dewaxed Fischer-Tropsch (F-T) material (i.e., hydrocarbons, waxy hydrocarbons, waxes and possible analogous oxygenates); preferably hydrodewaxed or hydroisomerized/followed by cat and/or solvent dewaxing dewaxed F-T waxy hydrocarbons, or hydrodewaxed or hydroisomerized/followed by cat (or solvent) dewaxing dewaxed, F-T waxes, or mixtures thereof.

GTL base stock(s) and/or base oil(s) derived from GTL materials, especially, hydrodewaxed or hydroisomerized/followed by cat and/or solvent dewaxed wax or waxy feed, preferably F-T material derived base stock(s) and/or base oil(s), are characterized typically as having kinematic viscosities at 100° C. of from about 2 $mm^2$/s to about 50 $mm^2$/s (ASTM D445). They are further characterized typically as having pour points of −5° C. to about −40° C. or lower (ASTM D97). They are also characterized typically as having viscosity indices of about 80 to about 140 or greater (ASTM D2270).

In addition, the GTL base stock(s) and/or base oil(s) are typically highly paraffinic (>90% saturates), and may contain mixtures of monocycloparaffins and multicycloparaffins in combination with non-cyclic isoparaffins. The ratio of the naphthenic (i.e., cycloparaffin) content in such combinations varies with the catalyst and temperature used. Further, GTL base stock(s) and/or base oil(s) typically have very low sulfur and nitrogen content, generally containing less than about 10 ppm, and more typically less than about 5 ppm of each of these elements. The sulfur and nitrogen content of GTL base stock(s) and/or base oil(s) obtained from F-T material, especially F-T wax, is essentially nil. In addition, the absence of phosphorous and aromatics make this materially especially suitable for the formulation of low SAP products.

The term GTL base stock and/or base oil and/or wax isomerate base stock and/or base oil is to be understood as embracing individual fractions of such materials of wide viscosity range as recovered in the production process, mixtures of two or more of such fractions, as well as mixtures of one or two or more low viscosity fractions with one, two or more higher viscosity fractions to produce a blend wherein the blend exhibits a target kinematic viscosity.

The GTL material, from which the GTL base stock(s) and/or base oil(s) is/are derived is preferably an F-T material (i.e., hydrocarbons, waxy hydrocarbons, wax).

Base oils for use in the formulated lubricating oils useful in the present disclosure are any of the variety of oils corresponding to API Group I, Group II, Group III, Group IV, and Group V oils and mixtures thereof, preferably API Group II, Group III, Group IV, and Group V oils and mixtures thereof, more preferably the Group III to Group V base oils due to, their exceptional volatility, stability, viscometric and cleanliness features.

The base oil constitutes the major component of the engine oil lubricant composition of the present disclosure and typically is present in an amount ranging from about 50 to about 99 weight percent, preferably from about 70 to about 95 weight percent, and more preferably from about 85 to about 95 weight percent, based on the total weight of the composition. The base oil may be selected from any of the synthetic or natural oils typically used as crankcase lubricating oils for spark ignition and compression-ignited engines. The base oil conveniently has a kinematic viscosity, according to ASTM standards, of about 2.5 cSt to about 12 cSt (or mm$^2$/s) at 100° C. and preferably of about 2.5 cSt to about 9 cSt (or mm$^2$/s) at 100° C. Mixtures of synthetic and natural base oils may be used if desired. Mixtures of Group III, IV, V may be preferable.

Branched Hydrocarbon Base Oils

In accordance with this disclosure, branched hydrocarbons are useful base stocks. The branched hydrocarbons can have at least about 25%, or at least about 35%, or at least about 50% or higher, of the carbons in the form of methyl groups. In addition to the carbons in the form of methyl groups, it is further preferred that at least about 20% of the carbons are in the form of quaternary carbons.

The branched hydrocarbons can have at least about 20 carbon atoms, or at least about 24 carbon atoms, or at least about 28 carbon atoms, or higher numbers of carbon atoms.

Illustrative branched hydrocarbons useful in this disclosure include poly(branched alkene) polymers, branched alkanes, and branched alkenes. The poly(branched alkene) polymers are derived from a C4 to C28 branched alkenes, preferably C4 to C24 branched alkenes, more preferably C4 to C20 branched alkenes, and even more preferably C4 to C16 branched alkenes.

The number average molecular weights of the poly (branched alkene) polymers, which are known materials and generally available on a major commercial scale from suppliers such as Ineos under the trade name Indopol™, typically vary from about 250 to about 3,000.

The poly(branched alkene) fluids may be conveniently made by the polymerization of a branched alkene in the presence of a polymerization catalyst such as the Friedel-Crafts catalysts including, for example, aluminum trichloride, boron trifluoride or complexes of boron trifluoride with water, alcohols such as ethanol, propanol or butanol, carboxylic acids or esters such as ethyl acetate or ethyl propionate. For example the methods disclosed by U.S. Pat. No. 4,149,178 or 3,382,291 may be conveniently used herein. Other descriptions of poly(branched alkene) synthesis are found in the following U.S. Pat. Nos. 3,742,082; 3,769,363; 3,876,720; 4,239,930; 4,367,352; 4,413,156; 4,434,408; 4,910,355; 4,956,122; and 5,068,487.

Illustrative poly(branched alkene) polymers include, for example, polyisobutene, poly(2-methyl-1-butene), poly(3-methyl-1-butene), poly(2-methyl-2-butene), poly(4-methyl-1-pentene), poly(5-methyl-1-hexene), poly(6-methyl-1-heptene), poly(7-methyl-1-octene), poly(8-methyl-1-nonene), poly(9-methyl-1-decene), poly(10-methyl-1-undecene), poly(11-methyl-1-dodecene), poly(12-methyl-1-tridecene), poly(13-methyl-1-tetradecene), poly(14-methyl-1-pentadecene), poly(15-methyl-1-hexadecene), and the like.

Preferred poly(branched alkene) polymers useful in this disclosure include, for example, polyisobutene, hydrogenated polyisobutene, and the like.

Preferably, the poly(branched alkene) polymers have at least about 25% of the carbons in the form of methyl groups. Even more preferably, the poly(branched alkene) polymers have at least about 35% of the carbons in the form of methyl groups. Most preferably, the poly(branched alkene) polymers have at least about 50% of the carbons in the form of methyl groups. In addition to the carbons in the form of methyl groups, it is further preferred that at least about 20% of the carbons are in the form of quaternary carbons.

Illustrative branched alkanes useful in this disclosure include C20 to C54 branched alkanes. In particular, illustrative branched alkanes include, for example, isoeicosane, branched heneicosane, branched docosane, branched tricosane, branched tetracosane, branched pentacosane, branched hexacosane, branched heptacosane, branched octacosane, branched nonacosane, branched triacontane, squalane, and the like.

Preferred branched alkanes useful in this disclosure include, for example, branched alkanes having from about 20 to about 40 carbons, for example, isoeicosane, squalane, 2,2,4,10,12,12-hexamethyl-7-(3,5,5-trimethylhexyl)tridecane, and the like.

Preferably, the branched alkanes have at least about 25% of the carbons in the form of methyl groups. Even more preferably, the branched alkanes have at least about 35% of the carbons in the form of methyl groups. Most preferably, the branched alkanes have at least about 50% of the carbons in the form of methyl groups. In addition to the carbons in the form of methyl groups, it is further preferred that at least about 20% of the carbons are in the form of quaternary carbons.

Illustrative branched alkenes useful in this disclosure include C20 to C54 branched alkenes. Preferred branched alkenes useful in this disclosure include, for example, branched alkenes having from about 20 to about 40 carbons, for example, squalene, and the like.

Preferably, the branched alkenes have at least about 25% of the carbons in the form of methyl groups. Even more preferably, the branched alkenes have at least about 35% of the carbons in the form of methyl groups. Most preferably, the branched alkenes have at least about 50% of the carbons in the form of methyl groups.

Branched alkanes like squalane, branched alkenes like squalene, and hydrogenated polyisobutene like Panalane™ from Ineos are widely used in cosmetics. Squalane and squalene can also be derived from natural sources.

The branched hydrocarbon can be present in an amount of from about 1 to about 100 weight percent, or from about 5 to about 95 weight percent, or from about 10 to about 90 weight percent, or from about 20 to about 80 weight percent, based on the total weight of the formulated oil.

When the branched hydrocarbon, preferably a poly (branched alkene) or a branched alkane or a branched alkene, is used as a cobase stock, the lubricating oil base stock is present in an amount of from about 40 weight percent to about 100 weight percent, and the branched hydrocarbon, preferably a poly(branched alkene) or a branched alkane or a branched alkene, is present in an amount from about 1.0 to about 40 weight percent, based on the total weight of the lubricating oil.

Ester Base Oils

Esters comprise a useful base stock. Additive solvency and seal compatibility characteristics may be secured by the use of esters such as polyol esters of monocarboxylic acids, esters of dibasic acids with monoalkanols and monoesters of monoalcohols and monocarboxylic acids.

Particularly useful synthetic esters are branched polyol esters which are obtained by reacting one or more polyhydric alcohols, preferably the hindered polyols (such as the neopentyl polyols, e.g., neopentyl glycol, trimethylol ethane, 2-methyl-2-propyl-1,3-propanediol, trimethylol propane, pentaerythritol and dipentaerythritol) with single or mixed branched mono-carboxylic acids containing at least about 4 carbon atoms, preferably C5 to C30 branched mono-carboxylic acids including 2,2-dimethyl propionic acid (neopentanoic acid), neoheptanoic acid, neooctanoic acid, neononanoic acid, iso-neodecanoic acid, hexanoic acid, 2-ethyl hexanoic acid (2EH), 3,5,5-trimethyl hexanoic acid (TMH), isoheptanoic acid, isooctanoic acid, isononanoic acid, isodecanoic acid, or mixtures of any of these materials. These branched polyol esters include fully converted and partially converted polyol esters.

Particularly useful polyols include, for example, neopentyl glycol, 2,2-dimethylol butane, trimethylol ethane, trimethylol propane, trimethylol butane, mono-pentaerythritol, technical grade pentaerythritol, di-pentaerythritol, tri-pentaerythritol, ethylene glycol, propylene glycol and polyalkylene glycols (e.g., polyethylene glycols, polypropylene glycols, 1,4-butanediol, sorbitol and the like, 2-methylpropanediol, polybutylene glycols, etc., and blends thereof such as a polymerized mixture of ethylene glycol and propylene glycol). The most preferred alcohols are technical grade (e.g., approximately 88% mono-, 10% di- and 1-2% tri-pentaerythritol) pentaerythritol, mono-pentaerythritol, di-pentaerythritol, neopentyl glycol and trimethylol propane.

Particularly useful branched mono-carboxylic acids include, for example, 2,2-dimethyl propionic acid (neopentanoic acid), neoheptanoic acid, neooctanoic acid, neononanoic acid, neodecanoic acid, iso-hexanoic acid, 2-ethyl hexanoic acid (2EH), 3,5,5-trimethyl hexanoic acid (TMH), isoheptanoic acid, isooctanoic acid, isononanoic acid, isodecanoic acid, or mixtures of any of these materials. One especially preferred branched acid is 2,2-dimethyl propionic acid, 3,5,5-tri methyl hexanoic acid, or 2-(4,4-dimethylpentan-2-yl)-5,7,7-trimethyloctanoic acid. The term "neo" as used herein refers to a trialkyl acetic acid, i.e., an acid which is triply substituted at the alpha carbon with alkyl groups.

Mono- and/or di-carboxylic linear acids may be useful in this disclosure, and include any linear alkyl carboxylic acid having a carbon number in the range between about C2 to C18, preferably C2 to C10.

Preferably, the branched polyol ester is derived from a polyhydric alcohol and a branched mono-carboxylic acid. Even more preferably, the branched mono-carboxylic acid and the polyol ester have at least about 25% of the carbons in the form of methyl groups. Even more preferably, the branched mono-carboxylic acid and the polyol ester have at least about 35% of the carbons in the form of methyl groups. Even more preferably, the branched mono-carboxylic acid and the polyol ester have at least about 40% of the carbons in the form of methyl groups. Most preferably, the branched mono-carboxylic acid and the polyol ester have at least about 50% of the carbons in the form of methyl groups. In addition to the carbons in the form of methyl groups, it is further preferred that at least about 20% of the carbons are in the form of quaternary carbons. One especially preferred branched acid is 2,2-dimethyl propionic acid, 3,5,5-trimethyl hexanoic acid, or 2-(4,4-dimethylpentan-2-yl)-5,7,7-trimethyloctanoic acid.

The percentage of carbons in the form of methyl groups can also be determined by use of Carbon-13 Nuclear Magnetic Resonance (NMR) method. Preferably, the percentage of carbons in the form of methyl groups is determined with the help of Distortionless Enhancement by Polarization Transfer (DEPT) Carbon-13 NMR method.

Preferred polyol esters useful in this disclosure include, for example, mono-pentaerythritol ester of branched mono-carboxylic acids, di-pentaerythritol ester of branched mono-carboxylic acids, trimethylolpropane ester of C8-C10 acids, and the like.

Other synthetic esters that can be useful in this disclosure are those which are obtained by reacting one or more polyhydric alcohols, preferably the hindered polyols (such as the neopentyl polyols, e.g., neopentyl glycol, trimethylol ethane, 2-methyl-2-propyl-1,3-propanediol, trimethylol propane, pentaerythritol and dipentaerythritol) with mono carboxylic acids containing at least about 4 carbon atoms, preferably branched C5 to C30 acids including caprylic acid, capric acid, lauric acid, myristic acid, palmitic acid, stearic acid, arachic acid, and behenic acid, or the corresponding branched chain fatty acids or unsaturated fatty acids such as oleic acid, or mixtures of any of these materials.

Illustrative esters useful in this disclosure include, for example, the esters of dicarboxylic acids such as phthalic acid, succinic acid, alkyl succinic acid, alkenyl succinic acid, maleic acid, azelaic acid, suberic acid, sebacic acid, fumaric acid, adipic acid, linoleic acid dimer, malonic acid, alkyl malonic acid, alkenyl malonic acid, etc., with a variety of branched alcohols such as butyl alcohol, hexyl alcohol, dodecyl alcohol, 2-ethylhexyl alcohol, etc. One especially preferred branched alcohol is 2,2-dimethyl propanol, 3,5,5-trimethyl hexanol, or 2-(4,4-dimethylpentan-2-yl)-5,7,7-trimethyloctanol. Specific examples of these types of esters include dibutyl adipate, di(2-ethylhexyl) sebacate, di-n-hexyl fumarate, dioctyl sebacate, diisooctyl azelate, diisodecyl azelate, dioctyl phthalate, didecyl phthalate, dieicosyl sebacate, etc.

Also useful are esters derived from renewable material such as coconut, palm, rapeseed, soy, sunflower and the like. These esters may be monoesters, di-esters, polyol esters, complex esters, or mixtures thereof. These esters are widely available commercially, for example, the Mobil P-51 ester of ExxonMobil Chemical Company.

Other ester base oils useful in this disclosure include adipate esters and more preferably dialkyl adipate esters such as diisopropyl adipate, diisobutyl adipate, diisopentyl adipate, diisohexyl adipate, diisooctyl adipate, diisononyl adipate, diisodecyl adipate, diisododecyl adipate, and mixtures thereof. For lower volatility, the preferred dialkyl adipate ester comprises diisooctyl adipate, diisononyl adipate, or diisodecyl adipate, diisododecyl adipate or their mixtures. One especially preferred adipate ester is 2,2-dimethyl propyl adipate, 3,5,5-trimethyl hexyl adipate, or 2-(4,4-dimethylpentan-2-yl)-5,7,7-trimethyloctyl adipate.

Preferably, the dialkyl adipate ester is derived from an adipic acid and an alkyl alcohol (e.g., isobutyl alcohol, butyl alcohol, hexyl alcohol, dodecyl alcohol, and the like).

More preferably, the dialkyl adipate ester is derived from adipic acid and a branched alkyl alcohol. Even more preferably, the branched alkyl alcohol and the dialkyl adipate ester have at least about 20% of the carbons in the form of methyl groups. Even more preferably, the branched alcohol and the dialkyl adipate ester have at least about 25% of the carbons in the form of methyl groups. Even more preferably, the branched alcohol and the dialkyl adipate ester have at least about 30% of the carbons in the form of methyl groups. Most preferably, the branched alcohol and the dialkyl adipate ester have at least about 50% of the carbons in the form of methyl groups.

The dialkyl adipate ester can preferably be used in mixture with one or more hydrocarbon base oils described herein. Illustrative mixtures include, for example, diisobutyl adipate/hydrogenated polyisobutene (80/20), diisobutyl adipate/hydrogenated polyisobutene (60/40), diisobutyl adipate/hydrogenated polyisobutene (40/60), diisobutyl adipate/hydrogenated polyisobutene (20/80), diisobutyl adipate/isoeicosane (80/20), diisobutyl adipate/isoeicosane (60/40), diisobutyl adipate/isoeicosane (40/60), diisobutyl adipate/isoeicosane (20/80), and the like.

When the dialkyl adipate ester is used in mixture with a hydrocarbon base oil, the weight ratio of dialkyl adipate ester:hydrocarbon base oil can range from about 1:99 to about 99:1, or from about 5:95 to about 95:5, or from about 10:90 to about 90:10, or from about 25:75 to about 75:25, or intermediate ratios. The weight ratio can also be 50:50. This ratio can be adjusted to reach a certain solubility for an additive or to reach a certain viscosity.

Other ester base oils useful in this disclosure include, for example, mono-esters and more preferably mono-esters of branched alkyl acids and branched alcohols such as isopropyl isohexadodecanoate, isopropyl isooctadecanoate, isobutyl isononanoate, isobutyl isodecanoate, isobutyl neodecanoate, isobutyl isododecanoate, isobutyl isotridecanoate, isobutyl isotetradecanoate, isobutyl isohexadecanoate, isobutyl isooctadecanoate, isopentyl isononanoate, isopentyl isodecanoate, isopentyl neodecanoate, isopentyl isododecanoate, isopentyl isotridecanoate, isopentyl isotetradecanoate, isopentyl isohexadecanoate, isopentyl isooctadecanoate, neopental isononanoate, neopentyl isodecanoate, neopentyl neodecanoate, neopentyl isododecanoate, neopentyl isotridecanoate, neopentyl isotetradecanoate, neopentyl isohexadecanoate, neopentyl isooctadecanoate, isohexyl isononanoate, isohexyl isodecanoate, isohexyl neodecanoate, isohexyl isododecanoate, isohexyl isotridecanoate, isohexyl isotetradecanoate, isohexyl isohexadecanoate, isohexyl isooctadecanoate, isoheptanol isononanoate, isoheptanol isodecanoate, isoheptanol neodecanoate, isoheptanol isododecanoate, isoheptanol isotridecanoate, isoheptanol isotetradecanoate, isoheptanol isohexadecanoate, isoheptanol isooctadecanoate, isooctyl isononanoate, isooctyl isodecanoate, isooctyl neodecanoate, isooctyl isododecanoate, isooctyl isotridecanoate, isooctyl isotetradecanoate, isooctyl isohexadecanoate, isooctyl isooctadecanoate, isononyl isononanoate, isononyl isodecanoate, isononyl neodecanoate, isononyl isododecanoate, isononyl isotridecanoate, isononyl isotetradecanoate, isononyl isohexadecanoate, isononyl isooctadecanoate, isodecyl isononanoate, isodecyl isodecanoate, isodecyl neodecanoate, isodecyl isododecanoate, isodecyl isotridecanoate, isodecyl isotetradecanoate, isodecyl isohexadecanoate, isodecyl isooctadecanoate, neodecyl isononanoate, neodecyl isodecanoate, neodecyl neodecanoate, neodecyl isododecanoate, neodecyl isotridecanoate, neodecyl isotetradecanoate, neodecyl isohexadecanoate, neodecyl isooctadecanoate, isododecyl neopentanoate, isododecyl isooctanoate, isododecyl isononanoate, isododecyl isodecanoate, isododecyl neodecanoate, isododecyl isododecanoate, isododecyl isotridecanoate, isododecyl isotetradecanoate, isododecyl isohexadecanoate, isododecyl isooctadecanoate, isotridecyl neopentanoate, isotridecyl isooctanoate, isotridecyl isononanoate, isotridecyl isodecanoate, isotridecyl neodecanoate, isotridecyl isododecanoate, isotridecyl isotridecanoate, isotridecyl isotetradecanoate, isotridecyl isohexadecanoate, isotridecyl isooctadecanoate, isotetradecyl neopentanoate, isotetradecyl isooctanoate, isotetradecyl isononanoate, isotetradecyl isodecanoate, isotetradecyl neodecanoate, isotetradecyl isododecanoate, isotetradecyl isotridecanoate, isotetradecyl isotetradecanoate, isotetradecyl isohexadecanoate, isotetradecyl isooctadecanoate, isohexadecyl isobutanoate, isohexadeyl neopentanoate, isohexadeyl isooctanoate, isohexydecyl isononanoate, isohexadecyl isodecanoate, isohexadecyl neodecanoate, isohexadecyl isododecanoate, isohexadecyl isotridecanoate, isohexadecyl isotetradecanoate, isohexadecyl isohexadecanoate, isohexadecyl isooctadecanoate, isohexadecyl isononanoate, isohexadecyl isodecanoate, isohexadecyl neodecanoate, isohexadecyl isododecanoate, isohexadecyl isotridecanoate, isohexadecyl isohexadecanoate, isohexadecyl isohexadecanoate, isohexadecyl isooctadecanoate, isooctadecyl isobutanoate, isooctadeyl neopentanoate, isooctadeyl isooctanoate, isooctadecyl isononanoate, isooctadecyl isodecanoate, isooctadecyl neodecanoate, isooctadecyl isododecanoate, isooctadecyl isotridecanoate, isooctadecyl isotetradecanoate, isooctadecyl isohexadecanoate, isohexadecyl isooctadecanoate, isooctadecyl isooctanoate, or their mixtures.

Particularly useful branched mono-carboxylic acids include, for example, isobutanoic acid, 2,2-dimethyl propionic acid (neopentanoic acid), neoheptanoic acid, neooctanoic acid, neononanoic acid, iso-hexanoic acid, neodecanoic acid, 2-ethyl hexanoic acid (2EH), 3,5,5-trimethyl hexanoic acid (TMH), isoheptanoic acid, isooctanoic acid, isononanoic acid, isodecanoic acid, isotetradecanoic acid, isohexadecanoic (isopalmitic acid), isooctadecanoic acid (isostearic acid), or mixtures of any of these materials. One especially preferred branched acid is isobutanoic acid, 2,2-dimethyl propionic acid, 3,5,5-trimethyl hexanoic acid, or 2-(4,4-dimethylpentan-2-yl)-5,7,7-trimethyloctanoic acid.

Particularly useful branched mono-alcohols include, for example, 2-methyl propanol, 2,2-dimethyl propanol (neopentanol), neoheptanol, neooctanol, neononanol, neo-hexanol, neodecanol, 2-ethyl hexanol (2EH), 3,5,5-trimethyl hexanol, isoheptanol, isononanol, isodecanol, isododecanol, isotridecanol, isotetradecanol, isohexadecanol, isooctadecanol (isostearyl alcohol), or mixtures of any of these materials. One especially preferred branched alcohol is 2-methyl propanol, 2,2-dimethyl propanol, 3,5,5-trimethyl hexanol, or 2-(4,4-dimethylpentan-2-yl)-5,7,7-trimethyloctanol.

It is further preferred that the branched alkyl acid or the branched alkyl alcohol is derived from a renewable source.

Preferably, the branched alkyl alcohol and the branched alkyl acid have at least about 20% of the carbons in the form of methyl groups. Even more preferably, the branched alcohol and the branched alkyl acid have at least about 25% of the carbons in the form of methyl groups. Even more preferably, the branched alcohol and the branched alkyl acid have at least about 30% of the carbons in the form of methyl groups. Most preferably, the branched alcohol and branched alkyl acid have at least about 50% of the carbons in the form of methyl groups.

The mono-ester derived from a branched alkyl acid and a branched alkyl alcohol can preferably be used in mixture with one or more hydrocarbon base oils described herein. Illustrative mixtures include, for example, isononyl isononanoate/hydrogenated polyisobutene (80/20), isononyl isononanoate/hydrogenated polyisobutene (60/40), isononyl isononanoate/hydrogenated polyisobutene (40/60), isononyl isononanoate/hydrogenated polyisobutene (20/80), isononyl isononanoate/hydrogenated polyisobutene (80/20), isononyl isononanoate/hydrogenated polyisobutene (60/40), isononyl isononanoate/isoeicosane (40/60), isononyl isononanoate/isoeicosane (20/80), and the like.

When the mono-ester derived from a branched alkyl acid and a branched alkyl alcohol is used in mixture with a hydrocarbon base oil, the weight ratio of dialkyl adipate ester:hydrocarbon base oil can range from about 1:99 to about 99:1, or from about 5:95 to about 95:5, or from about 10:90 to about 90:10, or from about 25:75 to about 75:25, or intermediate ratios. The weight ratio can also be 50:50. This ratio can be adjusted to reach a certain solubility for an additive or to reach a certain viscosity.

Engine oil formulations containing renewable esters are included in this disclosure. For such formulations, the renewable content of the ester is typically greater than about 70 weight percent, preferably more than about 80 weight percent and most preferably more than about 90 weight percent.

The ester can be present in an amount of from about 1 to about 100 weight percent, or from about 5 to about 95 weight percent, or from about 10 to about 90 weight percent, or from about 20 to about 80 weight percent, based on the total weight of the formulated oil.

When the ester is used as a cobase stock, the lubricating oil base stock is present in an amount of from about 70 weight percent to about 95 weight percent, and the polyol ester is present in an amount from about 1.0 to about 40 weight percent, based on the total weight of the lubricating oil.

Ashless Antiwear Additives

In accordance with this disclosure, the lubricating engine oils have at least one ashless antiwear additive selected from a phosphorus-containing ashless antiwear additive, a sulfur-containing ashless antiwear additive, and a phosphorus/sulfur-containing ashless antiwear additive. Illustrative ashless antiwear additives useful in this disclosure include, for example, amine phosphates, thiophosphates, dithiophosphates, amine salts of sulfurized phosphates, alkylated triphenyl phosphorothionates (e.g., butylated triphenyl phosphorothionate), and mixtures thereof, and the like. These ashless antiwear additives can be obtained commercially from suppliers such as BASF under the trade name Irgalube 353, Irgalube 349, Irgalube 875, Irgalube 232, and from Vanderbilt Chemicals, LLC under the trade name Vanlube 9123.

In particular, a phosphate ester or salt may be a monohydrocarbyl, dihydrocarbyl or a trihydrocarbyl phosphate, wherein each hydrocarbyl group is saturated. In one embodiment, each hydrocarbyl group independently contains from about 8 to about 30, or from about 12 up to about 28, or from about 14 up to about 24, or from about 14 up to about 18 carbons atoms. In one embodiment, the hydrocarbyl groups are alkyl groups. Examples of hydrocarbyl groups include tridecyl, tetradecyl, pentadecyl, hexadecyl, heptadecyl, octadecyl groups and mixtures thereof.

A phosphate ester or salt is a phosphorus acid ester prepared by reacting one or more phosphorus acid or anhydride with a saturated alcohol. The phosphorus acid or anhydride is generally an inorganic phosphorus reagent, such as phosphorus pentoxide, phosphorus trioxide, phosphorus tetroxide, phosphorous acid, phosphoric acid, phosphorus halide, lower phosphorus esters, or a phosphorus sulfide, including phosphorus pentasulfide, and the like. Lower phosphorus acid esters generally contain from 1 to about 7 carbon atoms in each ester group. Alcohols used to prepare the phosphorus acid esters or salts. Examples of commercially available alcohols and alcohol mixtures include Alfol 1218 (a mixture of synthetic, primary, straight-chain alcohols containing 12 to 18 carbon atoms); Alfol 20+ alcohols (mixtures of C 18-C 28 primary alcohols having mostly C20 alcohols as determined by GLC (gas-liquid-chromatography)); and Alfol22+ alcohols (C 18-C 28 primary alcohols containing primarily C 22 alcohols). Alfol alcohols are available from Continental Oil Company. Another example of a commercially available alcohol mixture is Adol 60 (about 75% by weight of a straight chain C 22 primary alcohol, about 15% of a C 20 primary alcohol and about 8% of C 18 and C 24 alcohols). The Adol alcohols are marketed by Ashland Chemical.

A variety of mixtures of monohydric fatty alcohols derived from naturally occurring triglycerides and ranging in chain length from C 8 to C 18 are available from Procter & Gamble Company. These mixtures contain various amounts of fatty alcohols containing 12, 14, 16, or 18 carbon atoms. For example, CO-1214 is a fatty alcohol mixture containing 0.5% of C 10 alcohol, 66.0% of C 12 alcohol, 26.0% of C 14 alcohol and 6.5% of C 16 alcohol.

Another group of commercially available mixtures include the "Neodol" products available from Shell Chemical Co. For example, Neodol 23 is a mixture of C 12 and C 13 alcohols; Neodol 25 is a mixture of C 12 to C 15 alcohols; and Neodol 45 is a mixture of C 14 to C 15 linear alcohols. The phosphate contains from about 14 to about 18 carbon atoms in each hydrocarbyl group. The hydrocarbyl groups of the phosphate are generally derived from a mixture of fatty alcohols having from about 14 up to about 18 carbon atoms. The hydrocarbyl phosphate may also be derived from a fatty vicinal diol. Fatty vicinal diols include those available from Ashland Oil under the general trade designation Adol 114 and Adol 158. The former is derived from a straight chain alpha olefin fraction of C 11-C 14, and the latter is derived from a C 15-C 18 fraction.

The phosphate salts may be prepared by reacting an acidic phosphate ester with an amine compound or a metallic base to form an amine or a metal salt. The amines may be monoamines or polyamines. Useful amines include those amines disclosed in U.S. Pat. No. 4,234,435.

The monoamines generally contain a hydrocarbyl group which contains from 1 to about 30 carbon atoms, or from 1 to about 12, or from 1 to about 6. Examples of primary monoamines useful in the present disclosure include methylamine, ethylamine, propylamine, butylamine, cyclopentylamine, cyclohexylamine, octylamine, dodecylamine, allylamine, cocoamine, stearylamine, and laurylamine. Examples of secondary monoamines include dimethylamine, diethylamine, dipropylamine, dibutylamine, dicyclopentylamine, dicyclohexylamine, methylbutylamine, ethylhexylamine, and the like.

An amine is a fatty (C8-30) amine which includes n-octylamine, n-decylamine, n-dodecylamine, n-tetradecylamine, n-hexadecylamine, n-octadecylamine, oleyamine, etc. Also useful fatty amines include commercially available fatty amines such as "Armeen" amines (products available from Akzo Chemicals, Chicago, Ill.), such Armeen C, Armeen O, Armeen O L, Armeen T, Armeen H T, Armeen S and Armeen S D, wherein the letter designation relates to the fatty group, such as coco, oleyl, tallow, or stearyl groups.

Other useful amines include primary ether amines, such as those represented by the formula, R"(OR')xNH2, wherein R' is a divalent alkylene group having about 2 to about 6 carbon atoms; x is a number from one to about 150, or from about one to about five, or one; and R" is a hydrocarbyl group of about 5 to about 150 carbon atoms. An example of an ether amine is available under the name SURFAM® amines produced and marketed by Mars Chemical Company, Atlanta, Ga. Preferred etheramines are exemplified by those identified as SURFAM P14B (decyloxypropylamine), SURFAM P16A (linearC16), SURFAM P17B (tridecyloxypropylamine). The carbon chain lengths (i.e., C14, etc.) of the SURFAMS described above and used hereinafter are approximate and include the oxygen ether linkage.

An amine is a tertiary-aliphatic primary amine. Generally, the aliphatic group, preferably an alkyl group, contains from about 4 to about 30, or from about 6 to about 24, or from about 8 to about 22 carbon atoms. Usually the tertiary alkyl primary amines are monoamines the alkyl group is a hydrocarbyl group containing from one to about 27 carbon atoms and R6 is a hydrocarbyl group containing from 1 to about 12 carbon atoms. Such amines are illustrated by tert-butylamine, tert-hexylamine, 1-methyl-1-amino-cyclohexane, tert-octylamine, tert-decylamine, tert-dodecylamine, tert-tetradecylamine, tert-hexadecylamine, tert-octadecylamine, tert-tetracosanylamine, and tert-octacosanylamine. Mixtures of tertiary aliphatic amines may also be used in preparing the phosphate salt. Illustrative of amine mixtures of this type are "Primene 81R" which is a mixture of C11-C14 tertiary alkyl primary amines and "Primene JMT" which is a similar mixture of C18-C22 tertiary alkyl primary amines (both are available from Rohm and Haas Company). The tertiary aliphatic primary amines and methods for their preparation are known to those of ordinary skill in the art. An amine is a heterocyclic polyamine. The heterocyclic polyamines include aziridines, azetidines, azolidines, tetra- and dihydropyridines, pyrroles, indoles, piperidines, imidazoles, di- and tetra-hydroimidazoles, piperazines, isoindoles, purines, morpholines, thiomorpholines, N-aminoalkylmorpholines, N-aminoalkylthiomorpholines, N-aminoalkyl-piperazines, N,N'-diaminoalkylpiperazines, azepines, azocines, azonines, azecines and tetra-, di- and perhydro derivatives of each of the above and mixtures of two or more of these heterocyclic amines. Preferred heterocyclic amines are the saturated 5- and 6-membered heterocyclic amines containing only nitrogen, oxygen and/or sulfur in the hetero ring, especially the piperidines, piperazines, thiomorpholines, morpholines, pyrrolidines, and the like. Piperidine, aminoalkyl substituted piperidines, piperazine, aminoalkyl substituted piperazines, morpholine, aminoalkyl substituted morpholines, pyrrolidine, and aminoalkyl-substituted pyrrolidines, are especially preferred. Usually the aminoalkyl substituents are substituted on a nitrogen atom forming part of the hetero ring. Specific examples of such heterocyclic amines include N-aminopropylmorpholine, N-aminoethylpiperazine, and N,N'-diaminoethylpiperazine. Hydroxy heterocyclic polyamines are also useful. Examples include N-(2-hydroxyethyl)cyclohexylamine, 3-hydroxycyclopentylamine, parahydroxyaniline, N-hydroxyethylpiperazine, and the like.

Lubricating compositions also may include a fatty imidazoline or a reaction product of a fatty carboxylic acid and at least one polyamine. The fatty imidazoline has fatty substituents containing from 8 to about 30, or from about 12 to about 24 carbon atoms. The substituent may be saturated or unsaturated, heptadeceneyl derived oleyl groups, preferably saturated. In one aspect, the fatty imidazoline may be prepared by reacting a fatty carboxylic acid with a polyalkylenepolyamine, such as those discussed above. The fatty carboxylic acids are generally mixtures of straight and branched chain fatty carboxylic acids containing about 8 to about 30 carbon atoms, or from about 12 to about 24, or from about 16 to about 18. Carboxylic acids include the polycarboxylic acids or carboxylic acids or anhydrides having from 2 to about 4 carbonyl groups, preferably 2. The polycarboxylic acids include succinic acids and anhydrides and Diels-Alder reaction products of unsaturated monocarboxylic acids with unsaturated carboxylic acids (such as acrylic, methacrylic, maleic, fumaric, crotonic and itaconic acids). Preferably, the fatty carboxylic acids are fatty monocarboxylic acids, having from about 8 to about 30, preferably about 12 to about 24 carbon atoms, such as octanoic, oleic, stearic, linoleic, dodecanoic, and tall oil acids, preferably stearic acid. The fatty carboxylic acid is reacted with at least one polyamine. The polyamines may be aliphatic, cycloaliphatic, heterocyclic or aromatic. Examples of the polyamines include alkylene polyamines and heterocyclic polyamines.

Hydroxyalkyl groups are to be understood as meaning, for example, monoethanolamine, diethanolamine or triethanolamine, and the term amine also includes diamine. The amine used for the neutralization depends on the phosphoric esters used. The EP additive according to the disclosure has the following advantages. It very high effectiveness when used in low concentrations and it is free of chlorine. For the neutralization of the phosphoric esters, the latter are taken and the corresponding amine slowly added with stirring. The resulting heat of neutralization is removed by cooling. The EP additive according to the disclosure can be incorporated into the respective base liquid with the aid of fatty substances (e.g. tall oil fatty acid, oleic acid, etc.) as solubilizers. The base liquids used are napthenic or paraffinic base oils, synthetic oils (e.g. polyglycols, mixed polyglycols), polyolefins, carboxylic esters, and the like.

The composition comprises at least one phosphorus containing extreme pressure additive. Examples of such additives are amine phosphate extreme pressure additives such as that known under the trade name IRGALUBE 349. Such amine phosphates are suitably present in an amount of from 0.01 to 2%, preferably 0.2 to 0.6% by weight of the lubricant composition.

At least one straight and/or branched chain saturated or unsaturated monocaboxylic acid which is optionally sulphurized in an amount which may be up to 35% by weight; and/or an ester of such an acid. At least one triazole or alkyl derivatives thereof, or short chain alkyl of up to 5 carbon atoms and is hydrogen, morphilino, alkyl, amido, amino, hydroxy or alkyl or aryl substituted derivatives thereof; or a triazole selected from 1,2,4 triazole, 1,2,3 triazole, 3-amino-1,2,4 triazole, 1-H-benzotriazole-1-yl-methylisocyanide, methylene-bis-benzotriazole and naphthotriazole. The neutral organic phosphate which forms a component of the formulation may be present in an amount of 0.01 to 4%, preferably 1.5 to 2.5% by weight of the composition. The above amine phosphates and any of the aforementioned benzo- or tolyltriazoles can be mixed together to form a single component capable of delivering antiwear performance. The neutral organic phosphate is also a conventional ingredient of lubricating compositions and any such neutral organic phosphate falling within the formula as previously defined may be employed.

Phosphates for use in the present disclosure include phosphates, acid phosphates, phosphites and acid phosphites. The phosphates include triaryl phosphates, trialkyl phosphates, trialkylaryl phosphates, triarylalkyl phosphates and trialkenyl phosphates. As specific examples of these, referred to are triphenyl phosphate, tricresyl phosphate, benzyldiphenyl phosphate, ethyldiphenyl phosphate, tributyl phosphate, ethyldibutyl phosphate, cresyldiphenyl phosphate, dicresylphenyl phosphate, ethylphenyldiphenyl phosphate, diethylphenylphenyl phosphate, propylphenyldiphenyl phosphate, dipropylphenylphenyl phosphate, triethylphenyl phosphate, tripropylphenyl phosphate, butylphenyldiphenyl phosphate, dibutylphenylphenyl phosphate, tributylphenyl phosphate, trihexyl phosphate, tri(2-ethylhexyl) phosphate, tridecyl phosphate, trilauryl phosphate, trimyristyl phosphate, tripalmityl phosphate, tristearyl phosphate, and trioleyl phosphate. The acid phosphates include, for example, 2-ethylhexyl acid phosphate, ethyl acid phosphate, butyl acid phosphate, oleyl acid phosphate, tetracosyl acid phosphate, isodecyl acid phosphate, lauryl acid phosphate, tridecyl acid phosphate, stearyl acid phosphate, and isostearyl acid phosphate.

The phosphites include, for example, triethyl phosphite, tributyl phosphite, triphenyl phosphite, tricresyl phosphite, tri(nonylphenyl) phosphite, tri(2-ethylhexyl) phosphite, tridecyl phosphite, trilauryl phosphite, triisooctyl phosphite, diphenylisodecyl phosphite, tristearyl phosphite, and trioleyl phosphite.

The acid phosphites include, for example, dibutyl hydrogenphosphite, dilauryl hydrogenphosphite, dioleyl hydrogenphosphite, distearyl hydrogenphosphite, and diphenyl hydrogenphosphite.

Amines that form amine salts with such phosphates include, for example, mono-substituted amines, di-substituted amines and tri-substituted amines.

Examples of the mono-substituted amines include butylamine, pentylamine, hexylamine, cyclohexylamine, octylamine, laurylamine, stearylamine, oleylamine and benzylamine; and those of the di-substituted amines include dibutylamine, dipentylamine, dihexylamine, dicyclohexylamine, dioctylamine, dilaurylamine, distearylamine, dioleylamine, dibenzylamine, stearyl monoethanolamine, decyl monoethanolamine, hexyl monopropanolamine, benzyl monoethanolamine, phenyl monoethanolamine, and tolyl monopropanolamine. Examples of tri-substituted amines include tributylamine, tripentylamine, trihexylamine, tricyclohexylamine, trioctylamine, trilaurylamine, tristearylamine, trioleylamine, tribenzylamine, dioleyl monoethanolamine, dilauryl monopropanolamine, dioctyl monoethanolamine, dihexyl monopropanolamine, dibutyl monopropanolamine, oleyl diethanolamine, stearyl dipropanolamine, lauryl diethanolamine, octyl dipropanolamine, butyl diethanolamine, benzyl diethanolamine, phenyl diethanolamine, tolyl dipropanolamine, xylyl diethanolamine, triethanolamine, and tripropanolamine.

Phosphates or their amine salts are added to the base oil in an amount of from 0.03 to 5% by weight, preferably from 0.1 to 4% by weight, relative to the total weight of the composition.

Carboxylic acids to be reacted with amines include, for example, aliphatic carboxylic acids, dicarboxylic acids (dibasic acids), and aromatic carboxylic acids. The aliphatic carboxylic acids have from 8 to 30 carbon atoms, and may be saturated or unsaturated, and linear or branched. Specific examples of the aliphatic carboxylic acids include pelargonic acid, lauric acid, tridecanoic acid, myristic acid, palmitic acid, stearic acid, isostearic acid, eicosanoic acid, behenic acid, triacontanoic acid, caproleic acid, undecylenic acid, oleic acid, linolenic acid, erucic acid, and linoleic acid. Specific examples of the dicarboxylic acids include octadecylsuccinic acid, octadecenylsuccinic acid, adipic acid, azelaic acid, and sebacic acid. One example of the aromatic carboxylic acids is salicylic acid. The amines to be reacted with carboxylic acids include, for example, polyalkylenepolyamines such as diethylenetriamine, triethylenetetramine, tetraethylenepentamine, pentaethylenehexamine, hexaethyleneheptamine, heptaethyleneoctamine, dipropylenetriamine, tetrapropylenepentanmne, and hexabutyleneheptamine; and alkanolamines such as monoethanolamine and diethanolamine. Of these, preferred are a combination of isostearic acid and tetraethylenepentamine, and a combination of oleic acid and diethanolamine. The reaction products of carboxylic acids and amines are added to the base oil in an amount of from 0.01 to 5% by weight, preferably from 0.03 to 3% by weight, relative to the total weight of the composition.

Important components are phosphites. As used herein, the term "hydrocarbyl substituent" or "hydrocarbyl group" is used in its ordinary sense, which is well-known to those skilled in the art. Specifically, it refers to a group having a carbon atom directly attached to the remainder of the molecule and having predominantly hydrocarbon character. Examples of hydrocarbyl groups include: hydrocarbon substituents, that is, aliphatic (e.g., alkyl or alkenyl), alicyclic (e.g., cycloalkyl, cycloalkenyl) substituents, and aromatic-, aliphatic-, and alicyclic-substituted aromatic substituents, as well as cyclic substituents wherein the ring is completed through another portion of the molecule (e.g., two substituents together form an alicyclic radical); the substituted hydrocarbon substituents, that is, substituents containing non-hydrocarbon groups which, in the context of this disclosure, do not alter the predominantly hydrocarbon substituent, hydroxy, alkoxy, nitro); hetero-atom containing substituents, that is, substituents which, while having a predominantly hydrocarbon character, in the context of this disclosure, contain other than carbon in a ring or chain otherwise composed of carbon atoms. Heteroatoms include sulfur, oxygen, nitrogen, and encompass substituents as pyridyl, furyl, thienyl and imidazolyl. In general, no more than two, preferably no more than one, non-hydrocarbon substituent will be present for every ten carbon atoms in the hydrocarbyl group; typically, there will be no non-hydrocarbon substituents in the hydrocarbyl group.

The term "hydrocarbyl group," in the context of the present disclosure, is also intended to encompass cyclic hydrocarbyl or hydrocarbylene groups, where two or more of the alkyl groups in the above structures together form a cyclic structure. The hydrocarbyl or hydrocarbylene groups of the present disclosure generally are alkyl or cycloalkyl groups which contain at least 3 carbon atoms. Preferably or optimally containing sulfur, nitrogen, or oxygen, they will contain 4 to 24, and alternatively 5 to 18 carbon atoms. In another embodiment they contain about 6, or exactly 6 carbon atoms. The hydrocarbyl groups can be tertiary or preferably primary or secondary groups; in one embodiment the component is a di(hydrocarbyl)hydrogen phosphite and each of the hydrocarbyl groups is a primary alkyl group; in another embodiment the component is a di(hydrocarbyl) hydrogen phosphite and each of the hydrocarbyl groups is a secondary alkyl group. In yet another embodiment the component is a hydrocarbylenehydrogen phosphite.

Examples of straight chain hydrocarbyl groups include methyl, ethyl, n-propyl, n-butyl, n-hexyl, n-octyl, n-decyl, n-dodecyl, n-tetradecyl, stearyl, n-hexadecyl, n-octadecyl, oleyl, and cetyl. Examples of branched-chain hydrocarbon groups include isopropyl, isobutyl, secondary butyl, tertiary butyl, neopentyl, 2-ethylhexyl, and 2,6-dimethylheptyl. Examples of cyclic groups include cyclobutyl, cyclopentyl, methylcyclopentyl, cyclohexyl, methylcyclohexyl, cycloheptyl, and cyclooctyl. A few examples of aromatic hydrocarbyl groups and mixed aromatic-aliphatic hydrocarbyl groups include phenyl, methylphenyl, tolyl, and naphthyl.

The R groups can also comprise a mixture of hydrocarbyl groups derived from commercial alcohols. Examples of some monohydric alcohols and alcohol mixtures include the commercially available "Alfol™" alcohols marketed by Continental Oil Corporation. Alfol™ 810, for instance, is a mixture containing alcohols consisting essentially of straight chain, primary alcohols having from 8 to 12 carbon atoms. Alfol™ 12 is a mixture of mostly C12 fatty alcohols; Alfol™ 22+ comprises C 18-28 primary alcohols having mostly C 22 alcohols, and so on. Various mixtures of monohydric fatty alcohols derived from naturally occurring triglycerides and ranging in chain length from C8 to C18 are available from Procter & Gamble Company. "Neodol™" alcohols are available from Shell Chemical Co., where, for instance, Neodol™ 25 is a mixture of C 12 to C 15 alcohols.

Specific examples of some of the phosphites within the scope of the disclosure include phosphorous acid, mono-, di-, or tri-propyl phosphite; mono-, di-, or tri-butyl phosphite, di-, or tri-amyl phosphite; mono-, di-, or tri-hexyl phosphite; mono-, di-, or tri-phenyl; mono-, di- or tri-tolyl phosphite; mono-, di-, or tri-cresyl phosphite; dibutyl phenyl phosphite or mono-, di-, or tri-phosphite, amyl dicresyl phosphite.

The phosphorus compounds of the present disclosure are prepared by well known reactions. One route the reaction of an alcohol or a phenol with phosphorus trichloride or by a transesterification reaction. Alcohols and phenols can be reacted with phosphorus pentoxide to provide a mixture of an alkyl or aryl phosphoric acid and a dialkyl or diaryl phosphoric acid. Alkyl phosphates can also be prepared by the oxidation of the corresponding phosphites. In any case, the reaction can be conducted with moderate heating. Moreover, various phosphorus esters can be prepared by reaction using other phosphorus esters as starting materials. Thus, medium chain (C9 to C22) phosphorus esters have been prepared by reaction of dimethylphosphite with a mixture of medium-chain alcohols by means of a thermal transesterification or an acid- or base-catalyzed transesterification; see for example U.S. Pat. No. 4,652,416. Most such materials are also commercially available; for instance, triphenyl phosphite is available from Albright and Wilson as Duraphos TPP™; di-n-butyl hydrogen phosphite from Albright and Wilson as Duraphos DBHP™; and triphenylthiophosphate from BASF as Irgalube TPPT™.

The other major component of the present composition is a hydrocarbon having ethylenic unsaturation. This would normally be described as an olefin or a diene, triene, polyene, and so on, depending on the number of ethylenic unsaturations present. Preferably the olefin is mono unsaturated, that is, containing only a single ethylenic double bond per molecule. The olefin can be a cyclic or a linear olefin. If a linear olefin, it can be an internal olefin or an alpha-olefin. The olefin can also contain aromatic unsaturation, i.e., one or more aromatic rings, provided that it also contains ethylenic (non-aromatic) unsaturation.

The olefin normally will contain 6 to 30 carbon atoms. Olefins having significantly fewer than 6 carbon atoms tend to be volatile liquids or gases which are not normally suitable for formulation into a composition suitable as an antiwear lubricant. Preferably the olefin will contain 6 to 18 or 6 to 12 carbon atoms, and alternatively 6 or 8 carbon atoms.

Among suitable olefins are alkyl-substituted cyclopentenes, hexenes, cyclohexene, alkyl-substituted cyclohexenes, heptenes, cycloheptenes, alkyl-substituted cycloheptenes, octenes including diisobutylene, cyclooctenes, alkyl-substituted cyclooctenes, nonenes, decenes, undecenes, dodecenes including propylene etramer, tridecenes, tetradecenes, pentadecenes, hexadecenes, heptadecenes, octadecenes, cyclooctadiene, norbornene, dicyclopentadiene, squalene, diphenylacetylene, and styrene. Highly preferred olefins are cyclohexene and 1-octene.

The mixtures of alcohols may be mixtures of different primary alcohols, mixtures of different secondary alcohols or mixtures of primary and secondary alcohols. Examples of useful mixtures include: n-butanol and n-octanol; n-pentanol and 2-ethyl-1-hexanol; isobutanol and n-hexanol; isobutanol and isoamyl alcohol; isopropanol and 2-methyl-4-pentanol; isopropanol and sec-butyl alcohol; isopropanol and isooctyl alcohol; and the like.

Organic triesters of phosphorus acids are also employed in lubricants. Typical esters include triarylphosphates, trialkyl phosphates, neutral alkylaryl phosphates, alkoxyalkyl phosphates, triaryl phosphite, trialkylphosphite, neutral alkyl aryl phosphites, neutral phosphonate esters and neutral phosphine oxide esters. In one embodiment, the long chain dialkyl phosphonate esters are used. More preferentially, the dimethyl-, diethyl-, and dipropyl-oleyl phophonates can be used. Neutral acids of phosphorus acids are the triesters rather than an acid (HO-P) or a salt of an acid.

Any C4 to C8 alkyl or higher phosphate ester may be employed in the disclosure. For example, tributyl phosphate (TBP) and tri isooctal phosphate (TOF) can be used. The specific triphosphate ester or combination of esters can easily be selected by one skilled in the art to adjust the density, viscosity etc. of the formulated fluid. Mixed esters, such as dibutyl octyl phosphate or the like may be employed rather than a mixture of two or more trialkyl phosphates.

A trialkyl phosphate is often useful to adjust the specific gravity of the formulation, but it is desirable that the specific trialkyl phosphate be a liquid at low temperatures. Consequently, a mixed ester containing at least one partially alkylated with a C3 to C4 alkyl group is very desirable, for example, 4-isopropylphenyl diphenyl phosphate or 3-butylphenyl diphenyl phosphate. Even more desirable is a triaryl phosphate produced by partially alkylating phenol with butylene or propylene to form a mixed phenol which is then reacted with phosphorus oxychloride as taught in U.S. Pat. No. 3,576,923.

Any mixed triaryl phosphate (TAP) esters may be used as cresyl diphenyl phosphate, tricresyl phosphate, mixed xylyl cresyl phosphates, lower alkylphenyl/phenyl phosphates, such as mixed isopropylphenyl/phenyl phosphates, t-butylphenyl phenyl phosphates. These esters are used extensively as plasticizers, functional fluids, gasoline additives, flame-retardant additives and the like.

The phosphoric acid ester, thiophosphoric acid ester, and amine salt thereof functions to enhance the lubricating performances, and can be selected from known compounds conventionally employed as extreme pressure agents. Generally employed are phosphoric acid esters, or an amine salt thereof which has an alkyl group, an alkenyl group, an alkylaryl group, or an aralkyl group, any of which contains approximately 3 to 30 carbon atoms.

Examples of the phosphoric acid esters include aliphatic phosphoric acid esters such as triisopropyl phosphate, tributyl phosphate, ethyl dibutyl phosphate, trihexyl phosphate, tri-2-ethylhexyl phosphate, trilauryl phosphate, tristearyl phosphate, and trioleyl phosphate; and aromatic phosphoric acid esters such as benzyl phenyl phosphate, allyl diphenyl phosphate, triphenyl phosphate, tricresyl phosphate, ethyl diphenyl phosphate, cresyl diphenyl phosphate, dicresyl phenyl phosphate, ethylphenyl diphenyl phosphate, diethylphenyl phenyl phosphate, propylphenyl diphenyl phosphate, dipropylphenyl phenyl phosphate, triethylphenyl phosphate, tripropylphenyl phosphate, butylphenyl diphenyl phosphate, dibutylphenyl phenyl phosphate, and tributylphenyl phosphate. Preferably, the phosphoric acid ester is a trialkylphenyl phosphate.

Also employable are amine salts of the above-mentioned phosphates. Amine salts of acidic alkyl or aryl esters of the phosphoric acid and thiophosphoric acid are also employable. Preferably, the amine salt is an amine salt of trialkylphenyl phosphate or an amine salt of alkyl phosphate.

One or any combination of the compounds selected from the group consisting of a phosphoric acid ester, and an amine salt thereof may be used.

The phosphorus acid ester and/or its amine salt function to enhance the lubricating performances, and can be selected from known compounds conventionally employed as extreme pressure agents. Generally employed are a phosphorus acid ester or an amine salt thereof which has an alkyl group, an alkenyl group, an alkylaryl group, or an aralkyl group, any of which contains approximately 3 to 30 carbon atoms.

Examples of the phosphorus acid esters include aliphatic phosphorus acid esters such as triisopropyl phosphite, tributyl phosphite, ethyl dibutyl phosphite, trihexyl phosphite, tri-2-ethylhexylphosphite, trilauryl phosphite, tristearyl phosphite, and trioleyl phosphite; and aromatic phosphorus acid esters such as benzyl phenyl phosphite, allyl diphenylphosphite, triphenyl phosphite, tricresyl phosphite, ethyl diphenyl phosphite, tributyl phosphite, ethyl dibutyl phosphite, cresyl diphenyl phosphite, dicresyl phenyl phosphite, ethylphenyl diphenyl phosphite, diethylphenyl phenyl phosphite, propylphenyl diphenyl phosphite, dipropylphenyl phenyl phosphite, triethylphenyl phosphite, tripropylphenyl phosphite, butylphenyl diphenyl phosphite, dibutylphenyl phenyl phosphite, and tributylphenyl phosphite. Also favorably employed are dilauryl phosphite, dioleyl phosphite, dialkyl phosphites, and diphenyl phosphite. Preferably, the phosphorus acid ester is a dialkyl phosphite or a trialkyl phosphite.

The phosphate salt may be derived from a polyamine. The polyamines include alkoxylated diamines, fatty polyamine diamines, alkylenepolyamines, hydroxy containing polyamines, condensed polyamines arylpolyamines, and heterocyclic polyamines. Commercially available examples of alkoxylated diamines include those amine where y in the above formula is one. Examples of these amines include Ethoduomeen T/13 and T/20 which are ethylene oxide condensation products of N-tallowtrimethylenediamine containing 3 and 10 moles of ethylene oxide per mole of diamine, respectively.

In another embodiment, the polyamine is a fatty diamine. The fatty diamines include mono- or dialkyl, symmetrical or asymmetrical ethylene diamines, propane diamines (1,2, or 1,3), and polyamine analogs of the above. Suitable commercial fatty polyamines are Duomeen C. (N-coco-1,3-diaminopropane), Duomeen S (N-soya-1,3-diaminopropane), Duomeen T (N-tallow-1,3-diaminopropane), and Duomeen O (N-oleyl-1,3-diaminopropane). "Duomeens" are commercially available from Armak Chemical Co., Chicago, Ill.

Such alkylenepolyamines include methylenepolyamines, ethylenepolyamines, butylenepolyamines, propylenepolyamines, pentylenepolyamines, etc. The higher homologs and related heterocyclic amines such as piperazines and N-amino alkyl-substituted piperazines are also included. Specific examples of such polyamines are ethylenediamine, triethylenetetramine, tris-(2-aminoethyl)amine, propylenediamine, trimethylenediamine, tripropylenetetramine, tetraethylenepentamine, hexaethyleneheptamine, pentaethylenehexamine, etc. Higher homologs obtained by condensing two or more of the above-noted alkyleneamines are similarly useful as are mixtures of two or more of the aforedescribed polyamines.

In one embodiment the polyamine is an ethylenepolyamine. Such polyamines are described in detail under the heading Ethylene Amines in Kirk Othmer's "Encyclopedia of Chemical Technology", 2d Edition, Vol. 7, pages 22-37, Interscience Publishers, New York (1965). Ethylenepolyamines are often a complex mixture of polyalkylenepolyamines including cyclic condensation products.

Other useful types of polyamine mixtures are those resulting from stripping of the above-described polyamine mixtures to leave, as residue, what is often termed "polyamine bottoms". In general, alkylenepolyamine bottoms can be characterized as having less than 2%, usually less than 1% (by weight) material boiling below about 200 C. A typical sample of such ethylene polyamine bottoms obtained from the Dow Chemical Company of Freeport, Tex. designated "E-100". These alkylenepolyamine bottoms include cyclic condensation products such as piperazine and higher analogs of diethylenetriamine, triethylenetetramine and the like. These alkylenepolyamine bottoms can be reacted solely with the acylating agent or they can be used with other amines, polyamines, or mixtures thereof. Another useful polyamine is a condensation reaction between at least one hydroxy compound with at least one polyamine reactant containing at least one primary or secondary amino group. The hydroxy compounds are preferably polyhydric alcohols and amines. The polyhydric alcohols are described below. (See carboxylic ester dispersants.) In one embodiment, the hydroxy compounds are polyhydric amines. Polyhydric amines include any of the above-described monoamines reacted with an alkylene oxide (e.g., ethylene oxide, propylene oxide, butylene oxide, etc.) having from two to about 20 carbon atoms, or from two to about four. Examples of polyhydric amines include tri-(hydroxypropyl)amine, tris-(hydroxymethyl)amino methane, 2-amino-2-methyl-1,3-propanediol, N,N,N',N'-tetrakis(2-hydroxypropyl)ethylenediamine, and N,N,N',N-tetrakis(2-hydroxyethyl) ethylenediamine, preferably tris(hydroxymethyl) aminomethane (THAM).

Polyamines which react with the polyhydric alcohol or amine to form the condensation products or condensed amines, are described above. Preferred polyamines include triethylenetetramine (TETA), tetraethylenepentamine (TEPA), pentaethylenehexamine (PEHA), and mixtures of polyamines such as the above-described "amine bottoms".

Preferred ashless antiwear additives selected from phosphorus-containing ashless antiwear additives, sulfur-containing ashless antiwear additives, and phosphorus/sulfur-containing ashless antiwear additives useful in this disclosure include, for example, amine phosphates, thiophosphates, dithiophosphates, amine salts of sulfurized phosphates, and mixtures thereof, and the like.

The concentration of ashless antiwear additive selected from a phosphorus-containing ashless antiwear additive, a sulfur-containing ashless antiwear additive, and a phosphorus/sulfur-containing ashless antiwear additive in the lubricating oils of this disclosure can range from 0.05 to 4.0 weight percent, preferably 0.1 to 2.0 weight percent, and more preferably from 0.2 weight percent to 1.0 weight percent, based on the total weight of the lubricating oil.

Other Additives

The formulated lubricating oil useful in the present disclosure may additionally contain one or more of the other commonly used lubricating oil performance additives including but not limited to antiwear agents, dispersants, other detergents, corrosion inhibitors, rust inhibitors, metal deactivators, extreme pressure additives, anti-seizure agents, wax modifiers, viscosity index improvers, viscosity modifiers, fluid-loss additives, seal compatibility agents, friction modifiers, lubricity agents, anti-staining agents, chromophoric agents, defoamants, demulsifiers, emulsifiers, densifiers, wetting agents, gelling agents, tackiness agents, colorants, and others. For a review of many commonly used additives, see Klamann in Lubricants and Related Products, Verlag Chemie, Deerfield Beach, Fla.; ISBN 0-89573-177-0. Reference is also made to "Lubricant Additives" by M. W. Ranney, published by Noyes Data Corporation of Parkridge, N J (1973); see also U.S. Pat. No. 7,704,930, the disclosure of which is incorporated herein in its entirety. These additives are commonly delivered with varying amounts of diluent oil, that may range from 5 weight percent to 50 weight percent.

The types and quantities of performance additives used in combination with the instant disclosure in lubricant compositions are not limited by the examples shown herein as illustrations.

Detergents

Illustrative detergents useful in this disclosure include, for example, alkali metal detergents, alkaline earth metal detergents, or mixtures of one or more alkali metal detergents and one or more alkaline earth metal detergents. A typical detergent is an anionic material that contains a long chain hydrophobic portion of the molecule and a smaller anionic or oleophobic hydrophilic portion of the molecule. The anionic portion of the detergent is typically derived from an organic acid such as a sulfur acid, carboxylic acid, phosphorous acid, phenol, or mixtures thereof. The counterion is typically an alkaline earth or alkali metal.

Salts that contain a substantially stochiometric amount of the metal are described as neutral salts and have a total base number (BN, as measured by ASTM D2896) of from 0 to 80. Many compositions are overbased, containing large amounts of a metal base that is achieved by reacting an excess of a metal compound (a metal hydroxide or oxide, for example) with an acidic gas (such as carbon dioxide). Useful detergents can be neutral, mildly overbased, or highly overbased. These detergents can be used in mixtures of neutral, overbased, highly overbased calcium salicylate, sulfonates, phenates and/or magnesium salicylate, sulfonates, phenates. The TBN ranges can vary from low, medium to high TBN products, including as low as 0 to as high as 600. Mixtures of low, medium, high TBN can be used, along with mixtures of calcium and magnesium metal based detergents, and including sulfonates, phenates, salicylates, and carboxylates. A detergent mixture with a metal ratio of 1, in conjunction of a detergent with a metal ratio of 2, and as high as a detergent with a metal ratio of 5, can be used. Borated detergents can also be used.

Alkaline earth phenates are another useful class of detergent. These detergents can be made by reacting alkaline earth metal hydroxide or oxide (CaO, Ca(OH)$_2$, BaO, Ba(OH)$_2$, MgO, Mg(OH)$_2$, for example) with an alkyl phenol or sulfurized alkylphenol. Useful alkyl groups include straight chain or branched C$_1$-C$_{30}$ alkyl groups, preferably, C$_4$-C$_{20}$ or mixtures thereof. Examples of suitable phenols include isobutylphenol, 2-ethylhexylphenol, nonylphenol, dodecyl phenol, and the like. It should be noted that starting alkylphenols may contain more than one alkyl substituent that are each independently straight chain or branched and can be used from 0.5 to 6 weight percent. When a non-sulfurized alkylphenol is used, the sulfurized product may be obtained by methods well known in the art. These methods include heating a mixture of alkylphenol and sulfurizing agent (including elemental sulfur, sulfur halides such as sulfur dichloride, and the like) and then reacting the sulfurized phenol with an alkaline earth metal base.

Metal salts of carboxylic acids are also useful as detergents. These carboxylic acid detergents may be prepared by reacting a basic metal compound with at least one carboxylic acid and removing free water from the reaction product. These compounds may be overbased to produce the desired TBN level. Detergents made from salicylic acid are one preferred class of detergents derived from carboxylic acids. Useful salicylates include long chain alkyl salicylates. One useful family of compositions is of the formula

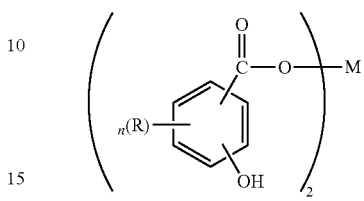

where R is an alkyl group having 1 to 30 carbon atoms, n is an integer from 1 to 4, and M is an alkaline earth metal. Preferred R groups are alkyl chains of at least C$_{11}$, preferably C$_{13}$ or greater. R may be optionally substituted with substituents that do not interfere with the detergent's function. M is preferably, calcium, magnesium, or barium. More preferably, M is calcium.

Hydrocarbyl-substituted salicylic acids may be prepared from phenols by the Kolbe reaction (see U.S. Pat. No. 3,595,791). The metal salts of the hydrocarbyl-substituted salicylic acids may be prepared by double decomposition of a metal salt in a polar solvent such as water or alcohol.

Alkaline earth metal phosphates are also used as detergents and are known in the art.

Detergents may be simple detergents or what is known as hybrid or complex detergents. The latter detergents can provide the properties of two detergents without the need to blend separate materials. See U.S. Pat. No. 6,034,039.

Preferred detergents include calcium phenates, calcium sulfonates, calcium salicylates, magnesium phenates, magnesium sulfonates, magnesium salicylates and other related components (including borated detergents), and mixtures thereof. Preferred mixtures of detergents include magnesium sulfonate and calcium salicylate, magnesium sulfonate and calcium sulfonate, magnesium sulfonate and calcium phenate, calcium phenate and calcium salicylate, calcium phenate and calcium sulfonate, calcium phenate and magnesium salicylate, calcium phenate and magnesium phenate.

Another family of detergents is oil soluble ashless nonionic detergent. Typical nonionic detergents are polyoxyethylene, polyoxypropylene, polyoxybutylene alkyl ethers, or nonylphenol ethoxylates. For reference, see "Nonionic Surfactants: Physical Chemistry" Martin J. Schick, CRC Press; 2 edition (Mar. 27, 1987). These detergents are less common in engine lubricant formulations, but offer a number of advantages such as improved solubility in ester base oils. The nonionic detergents that are soluble in hydrocarbons generally have a Hydrophilic-Lipophilic Balance (HLB) value of 10 or below.

The preferred detergents in this disclosure include detergents soluble in a branched hydrocarbon or a branched ester, preferably a polyol ester, more preferably a mono- or dipentaerythritol ester of at least one branched mono carboxylic acid, and even more preferably the nonionic detergents.

To minimize the effect of ash deposit on engine knock and pre-ignition, including low speed pre-ignition, the most preferred detergents in this disclosure is an ashless nonionic detergent with a Hydrophilic-Lipophilic Balance (HLB) value of 10 or below. These detergents are commercially available from for example, Croda Inc., under the trade designations "Alarmol PS11E" and "Alarmol PS15E", from for example the Dow Chemical Co. the trade designation "Ecosurf EH-3", "Tergitol 15-S-3", "Tergitol L-61", "Tergitol L-62", "Tergitol NP-4", "Tergitol NP-6", "Tergitol NP-7", "Tergitol NP-8", "Tergitol NP-9", "Triton X-15", and "Triton X-35".

The detergent concentration in the lubricating oils of this disclosure can range from 0.5 to 6.0 weight percent, preferably 0.6 to 5.0 weight percent, and more preferably from 0.8 weight percent to 4.0 weight percent, based on the total weight of the lubricating oil.

As used herein, the detergent concentrations are given on an "as delivered" basis. Typically, the active detergent is delivered with a process oil. The "as delivered" detergent typically contains from 20 weight percent to 100 weight percent, or from 40 weight percent to 60 weight percent, of active detergent in the "as delivered" detergent product.

Dispersants

During engine operation, oil-insoluble oxidation byproducts are produced. Dispersants help keep these byproducts in solution, thus diminishing their deposition on metal surfaces. Dispersants used in the formulation of the lubricating oil may be ashless or ash-forming in nature. Preferably, the dispersant is ashless. So called ashless dispersants are organic materials that form substantially no ash upon combustion. For example, non-metal-containing or borated metal-free dispersants are considered ashless. In contrast, metal-containing detergents discussed above form ash upon combustion.

Suitable dispersants typically contain a polar group attached to a relatively high molecular weight hydrocarbon chain. The polar group typically contains at least one element of nitrogen, oxygen, or phosphorus. Typical hydrocarbon chains contain 50 to 400 carbon atoms.

A particularly useful class of dispersants are the alkenylsuccinic derivatives, typically produced by the reaction of a long chain hydrocarbyl substituted succinic compound, usually a hydrocarbyl substituted succinic anhydride, with a polyhydroxy or polyamino compound. The long chain hydrocarbyl group constituting the oleophilic portion of the molecule which confers solubility in the oil, is normally a polyisobutylene group. Many examples of this type of dispersant are well known commercially and in the literature. Exemplary U.S. patents describing such dispersants are U.S. Pat. Nos. 3,172,892; 3,215,707; 3,219,666; 3,316,177; 3,341,542; 3,444,170; 3,454,607; 3,541,012; 3,630,904; 3,632,511; 3,787,374 and 4,234,435. Other types of dispersant are described in U.S. Pat. Nos. 3,036,003; 3,200,107; 3,254,025; 3,275,554; 3,438,757; 3,454,555; 3,565,804; 3,413,347; 3,697,574; 3,725,277; 3,725,480; 3,726,882; 4,454,059; 3,329,658; 3,449,250; 3,519,565; 3,666,730; 3,687,849; 3,702,300; 4,100,082; 5,705,458. A further description of dispersants may be found, for example, in European Patent Application No. 471071, to which reference is made for this purpose.

Hydrocarbyl-substituted succinic acid and hydrocarbyl-substituted succinic anhydride derivatives are useful dispersants. In particular, succinimide, succinate esters, or succinate ester amides prepared by the reaction of a hydrocarbon-substituted succinic acid compound preferably having at least 50 carbon atoms in the hydrocarbon substituent, with at least one equivalent of an alkylene amine are particularly useful, although on occasion, having a hydrocarbon substituent between 20-50 carbon atoms can be useful.

Succinimides are formed by the condensation reaction between hydrocarbyl substituted succinic anhydrides and amines. Molar ratios can vary depending on the polyamine. For example, the molar ratio of hydrocarbyl substituted succinic anhydride to TEPA can vary from 1:1 to 5:1. Representative examples are shown in U.S. Pat. Nos. 3,087,936; 3,172,892; 3,219,666; 3,272,746; 3,322,670; and 3,652,616, 3,948,800; and Canada Patent No. 1,094,044.

Succinate esters are formed by the condensation reaction between hydrocarbyl substituted succinic anhydrides and alcohols or polyols. Molar ratios can vary depending on the alcohol or polyol used. For example, the condensation product of a hydrocarbyl substituted succinic anhydride and pentaerythritol is a useful dispersant.

Succinate ester amides are formed by condensation reaction between hydrocarbyl substituted succinic anhydrides and alkanol amines. For example, suitable alkanol amines include ethoxylated polyalkylpolyamines, propoxylated polyalkylpolyamines and polyalkenylpolyamines such as polyethylene polyamines. One example is propoxylated hexamethylenediamine. Representative examples are shown in U.S. Pat. No. 4,426,305.

The molecular weight of the hydrocarbyl substituted succinic anhydrides used in the preceding paragraphs will typically range between 800 and 2,500 or more. The above products can be post-reacted with various reagents such as sulfur, oxygen, formaldehyde, carboxylic acids such as oleic acid. The above products can also be post reacted with boron compounds such as boric acid, borate esters or highly borated dispersants, to form borated dispersants generally having from 0.1 to 5 moles of boron per mole of dispersant reaction product.

Mannich base dispersants are made from the reaction of alkylphenols, formaldehyde, and amines. See U.S. Pat. No. 4,767,551, which is incorporated herein by reference. Process aids and catalysts, such as oleic acid and sulfonic acids, can also be part of the reaction mixture. Molecular weights of the alkylphenols range from 800 to 2,500. Representative examples are shown in U.S. Pat. Nos. 3,697,574; 3,703,536; 3,704,308; 3,751,365; 3,756,953; 3,798,165; and 3,803,039.

Typical high molecular weight aliphatic acid modified Mannich condensation products useful in this disclosure can be prepared from high molecular weight alkyl-substituted hydroxyaromatics or $HNR_2$ group-containing reactants.

Hydrocarbyl substituted amine ashless dispersant additives are well known to one skilled in the art; see, for example, U.S. Pat. Nos. 3,275,554; 3,438,757; 3,565,804; 3,755,433, 3,822,209, and 5,084,197.

Preferred dispersants include borated and non-borated succinimides, including those derivatives from mono-succinimides, bis-succinimides, and/or mixtures of mono- and bis-succinimides, wherein the hydrocarbyl succinimide is derived from a hydrocarbylene group such as polyisobutylene having a Mn of from 500 to 5000, or from 1000 to 3000, or 1000 to 2000, or a mixture of such hydrocarbylene groups, often with high terminal vinylic groups. Other preferred dispersants include succinic acid-esters and amides, alkylphenol-polyamine-coupled Mannich adducts, their capped derivatives, and other related components.

Polymethacrylate or polyacrylate derivatives are another class of dispersants. These dispersants are typically prepared by reacting a nitrogen containing monomer and a methacrylic or acrylic acid esters containing 5-25 carbon atoms in the ester group. Representative examples are shown in U.S. Pat. Nos. 2,100,993, and 6,323,164. Polymethacrylate and polyacrylate dispersants are normally used as multifunctional viscosity index improvers. The lower molecular weight versions can be used as lubricant dispersants or fuel detergents.

The use of polymethacrylate or polyacrylate dispersants are preferred in polar esters of a non-aromatic dicarboxylic acid, preferably adipate esters, since many other conventional dispersants are less soluble. The preferred dispersants for polyol esters in this disclosure include polymethacrylate and polyacrylate dispersants.

Such dispersants may be used in an amount of 0.1 to 20 weight percent, preferably 0.5 to 8 weight percent, or more preferably 0.5 to 4 weight percent. The hydrocarbon numbers of the dispersant atoms can range from C60 to C1000, or from C70 to C300, or from C70 to C200. These dispersants may contain both neutral and basic nitrogen, and mixtures of both. Dispersants can be end-capped by borates and/or cyclic carbonates.

Antiwear Agent

A metal alkylthiophosphate and more particularly a metal dialkyl dithio phosphate in which the metal constituent is zinc, or zinc dialkyl dithio phosphate (ZDDP) is a useful component of the lubricating oils of this disclosure. ZDDP can be derived from primary alcohols, secondary alcohols or mixtures thereof. ZDDP compounds generally are of the formula

where $R^1$ and $R^2$ are $C_1$-$C_{18}$ alkyl groups, preferably $C_2$-$C_{12}$ alkyl groups. These alkyl groups may be straight chain or branched. Alcohols used in the ZDDP can be 2-propanol, butanol, secondary butanol, pentanols, hexanols such as 4-methyl-2-pentanol, n-hexanol, n-octanol, 2-ethyl hexanol, alkylated phenols, and the like. Mixtures of secondary alcohols or of primary and secondary alcohol can be preferred. Alkyl aryl groups may also be used.

Preferable zinc dithiophosphates which are commercially available include secondary zinc dithiophosphates such as those available from for example, The Lubrizol Corporation under the trade designations "LZ 677A" "2L 1095" and "L 1371", from for example Chevron Oronite under the trade designation "OLOA 262" and from for example Afton Chemical under the trade designation "HITEC 7169".

ZDDP is typically used in amounts of from 0.4 weight percent to 1.2 weight percent, preferably from 0.5 weight percent to 1.0 weight percent, and more preferably from 0.6 weight percent to 0.8 weight percent, based on the total weight of the lubricating oil, although more or less can often be used advantageously. Preferably, the ZDDP is a secondary ZDDP and present in an amount of from 0.6 to 1.0 weight percent of the total weight of the lubricating oil.

Low phosphorus engine oil formulations are included in this disclosure. For such formulations, the phosphorus content is typically less than 0.12 weight percent preferably less than 0.10 weight percent, and most preferably less than 0.085 weight percent. Low phosphorus can be preferred in combination with the friction modifier.

Viscosity Index Improvers

Viscosity index improvers (also known as VI improvers, viscosity modifiers, and viscosity improvers) can be included in the lubricant compositions of this disclosure.

Viscosity index improvers provide lubricants with high and low temperature operability. These additives impart shear stability at elevated temperatures and acceptable viscosity at low temperatures.

Suitable viscosity index improvers include high molecular weight hydrocarbons, polyesters and viscosity index improver dispersants that function as both a viscosity index improver and a dispersant. Typical molecular weights of these polymers are between about 10,000 to 1,500,000, more typically about 20,000 to 1,200,000, and even more typically between about 50,000 and 1,000,000. The typical molecular weight for polymethacrylate or polyacrylate viscosity index improvers is less than about 50,000.

Examples of suitable viscosity index improvers are linear or star-shaped polymers and copolymers of methacrylate, butadiene, olefins, or alkylated styrenes. Polyisobutylene is a commonly used viscosity index improver. Another suitable viscosity index improver is polymethacrylate (copolymers of various chain length alkyl methacrylates, for example), some formulations of which also serve as pour point depressants. Other suitable viscosity index improvers include copolymers of ethylene and propylene, hydrogenated block copolymers of styrene and isoprene, and polyacrylates (copolymers of various chain length acrylates, for example). Specific examples include styrene-isoprene or styrene-butadiene based polymers of 50,000 to 200,000 molecular weight.

Olefin copolymers, are commercially available from Chevron Oronite Company LLC under the trade designation "PARATONE®" (such as "PARATONE® 8921" and "PARATONE® 8941"); from Afton Chemical Corporation under the trade designation "HiTECO" (such as "HiTEC® 5850B"; and from The Lubrizol Corporation under the trade designation "Lubrizol® 7067C". Hydrogenated polyisoprene star polymers are commercially available from Infineum International Limited, e.g., under the trade designation "SV200" and "SV600". Hydrogenated diene-styrene block copolymers are commercially available from Infineum International Limited, e.g., under the trade designation "SV 50".

The preferred viscosity index improvers in this disclosure when an ester of a non-aromatic dicarboxylic acid, preferably an alkyl adipate ester, is used as base oil, are polymethacrylate or polyacrylate polymers, including dispersant polymethacrylate and dispersant polyacrylate polymers. These polymers offer significant advantages in solubility in esters of a non-aromatic dicarboxylic acid, preferably alkyl adipate esters. The polymethacrylate or polyacrylate polymers can be linear polymers which are available from Evnoik Industries under the trade designation "Viscoplex®" (e.g., Viscoplex 6-954) or star polymers which are available from Lubrizol Corporation under the trade designation Asteric™ (e.g., Lubrizol 87708 and Lubrizol 87725).

In an embodiment of this disclosure, the viscosity index improvers may be used in an amount of from 1.0 to about 20% weight percent, preferably 5 to about 15 weight percent, and more preferably 8.0 to about 12 weight percent, based on the total weight of the formulated oil or lubricating engine oil.

As used herein, the viscosity index improver concentrations are given on an "as delivered" basis. Typically, the active polymer is delivered with a diluent oil. The "as delivered" viscosity index improver typically contains from 20 weight percent to 75 weight percent of an active polymer for polymethacrylate or polyacrylate polymers, or from 8 weight percent to 20 weight percent of an active polymer for olefin copolymers, hydrogenated polyisoprene star polymers, or hydrogenated diene-styrene block copolymers, in the "as delivered" polymer concentrate.

Antioxidants

Antioxidants retard the oxidative degradation of base oils during service. Such degradation may result in deposits on metal surfaces, the presence of sludge, or a viscosity increase in the lubricant. One skilled in the art knows a wide variety of oxidation inhibitors that are useful in lubricating oil compositions. See, Klamann in Lubricants and Related Products, op cite, and U.S. Pat. Nos. 4,798,684 and 5,084,197, for example.

Useful antioxidants include hindered phenols. These phenolic antioxidants may be ashless (metal-free) phenolic compounds or neutral or basic metal salts of certain phenolic compounds. Typical phenolic antioxidant compounds are the hindered phenolics which are the ones which contain a sterically hindered hydroxyl group, and these include those derivatives of dihydroxy aryl compounds in which the hydroxyl groups are in the o- or p-position to each other. Typical phenolic antioxidants include the hindered phenols substituted with $C_6+$ alkyl groups and the alkylene coupled derivatives of these hindered phenols. Examples of phenolic materials of this type 2-t-butyl-4-heptyl phenol; 2-t-butyl-4-octyl phenol; 2-t-butyl-4-dodecyl phenol; 2,6-di-t-butyl-4-heptyl phenol; 2,6-di-t-butyl-4-dodecyl phenol; 2-methyl-6-t-butyl-4-heptyl phenol; and 2-methyl-6-t-butyl-4-dodecyl phenol. Other useful hindered mono-phenolic antioxidants may include for example hindered 2,6-di-alkyl-phenolic proprionic ester derivatives. Bis-phenolic antioxidants may also be advantageously used in combination with the instant disclosure. Examples of ortho-coupled phenols include: 2,2'-bis(4-heptyl-6-t-butyl-phenol); 2,2'-bis(4-octyl-6-t-butyl-phenol); and 2,2'-bis(4-dodecyl-6-t-butyl-phenol). Para-coupled bisphenols include for example 4,4'-bis(2,6-di-t-butyl phenol) and 4,4'-methylene-bis(2,6-di-t-butyl phenol).

Effective amounts of one or more catalytic antioxidants may also be used. The catalytic antioxidants comprise an effective amount of a) one or more oil soluble polymetal organic compounds; and, effective amounts of b) one or more substituted N,N'-diaryl-o-phenylenediamine compounds or c) one or more hindered phenol compounds; or a combination of both b) and c). Catalytic antioxidants are more fully described in U.S. Pat. No. 8,048,833, herein incorporated by reference in its entirety.

Non-phenolic oxidation inhibitors which may be used include aromatic amine antioxidants and these may be used either as such or in combination with phenolics. Typical examples of non-phenolic antioxidants include: alkylated and non-alkylated aromatic amines such as aromatic mono-amines of the formula $R^8R^9R^{10}N$ where $R^8$ is an aliphatic, aromatic or substituted aromatic group, $R^9$ is an aromatic or a substituted aromatic group, and $R^{10}$ is H, alkyl, aryl or $R^{11}S(O)_xR^{12}$ where $R^{11}$ is an alkylene, alkenylene, or aralkylene group, $R^{12}$ is a higher alkyl group, or an alkenyl, aryl, or alkaryl group, and x is 0, 1 or 2. The aliphatic group $R^8$ may contain from 1 to 20 carbon atoms, and preferably contains from 6 to 12 carbon atoms. The alphatic group is an aliphatic group. Preferably, both $R^8$ and $R^9$ are aromatic or substituted aromatic groups, and the aromatic group may be a fused ring aromatic group such as naphthyl. Aromatic groups $R^8$ and $R^9$ may be joined together with other groups such as S.

Typical aromatic amines antioxidants have alkyl substituent groups of at least 6 carbon atoms. Examples of aliphatic groups include hexyl, heptyl, octyl, nonyl, and decyl. Generally, the aliphatic groups will not contain more than 14 carbon atoms. The general types of amine antioxidants useful in the present compositions include diphenylamines, phenyl naphthylamines, phenothiazines, imidodibenzyls and diphenyl phenylene diamines. Mixtures of two or more aromatic amines are also useful. Polymeric amine antioxidants can also be used. Particular examples of aromatic amine antioxidants useful in the present disclosure include: p,p'-dioctyldiphenylamine; t-octylphenyl-alpha-naphthylamine; phenyl-alphanaphthylamine; and p-octylphenyl-alpha-naphthylamine.

The preferred amine antioxidants in this disclosure include polymeric or oligomeric amines which are the polymerization reaction products of one or more substituted or hydrocarbyl-substituted diphenyl amines, one or more unsubstituted or hydrocarbyl-substituted phenyl naphthyl amines, or both one or more of unsubstituted or hydrocarbyl-substituted diphenylamine with one or more unsubstituted or hydrocarbyl-substituted phenyl naphthylamine. A representative schematic is presented below:

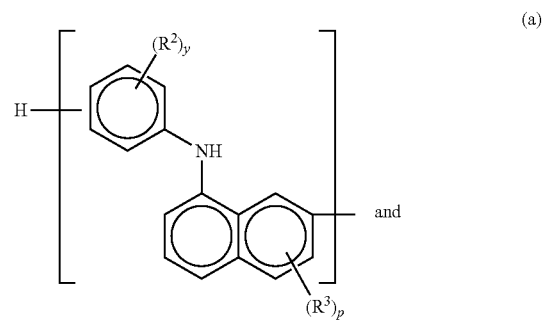

(a)

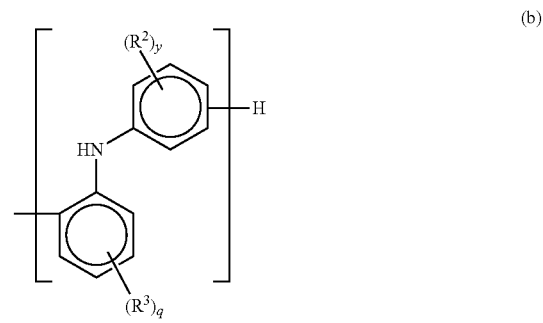

(b)

wherein (a) and (b) each range from zero to 10, preferably zero to 5, more preferably zero to 3, most preferably 1 to 3, provided (a)+(b) is at least 2; for example:

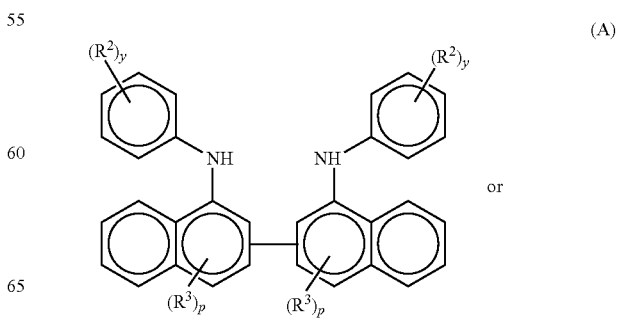

(A)

or

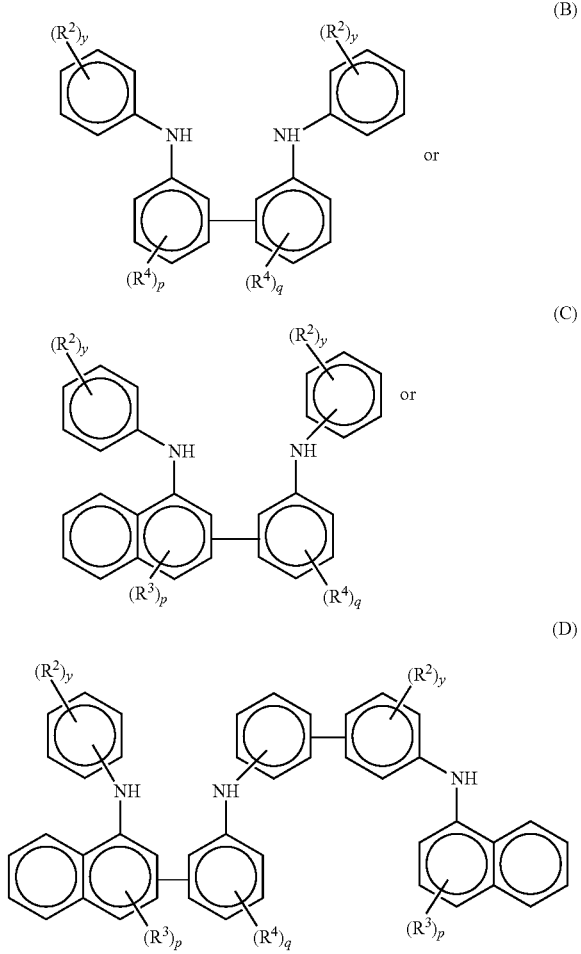

wherein $R^2$ is a styrene or $C_1$ to $C_{30}$ alkyl, $R^3$ is a styrene or $C_1$ to $C_{30}$ alkyl, $R^4$ is a styrene or $C_1$ to $C_{30}$ alkyl, preferably $R_2$ is a $C_1$ to $C_{30}$ alkyl, $R_3$ is a $C_1$ to $C_3$ alkyl, $R_4$ is a $C_1$ to $C_{30}$ alkyl, more preferably $R_2$ is a C4 to C10 alkyl, R3 is a C4 to C10 alkyl and R4 is a C4 to C10 alkyl, p, q and y individually range from 0 to up to the valence of the aryl group to which the respective R groups are attached, preferably at least one of p, q and y range from 1 to up to the valence of the aryl group to which the respective R group(s) are attached, more preferably p, q and y each individually range from at least 1 to up to the valence of the aryl group to which the respective R groups are attached.

Other more extensive oligomers are within the scope of this disclosure, but materials of formulae A, B, C and D are preferred. Examples can be also found in U.S. Pat. No. 8,492,321.

Polymeric or oligomeric amines are commercially available from Nyco S.A. under the trade designation of Nycoperf AO337.

The polymeric or oligomeric amine antioxidant is present in an amount in the range 0.5 to 10 wt % (active ingredient), preferably 2 to 5 wt % (active ingredient) of polymerized aminic antioxidant exclusive of any unpolymerized aryl amine which may be present or any added antioxidants.

Sulfurized alkyl phenols and alkali or alkaline earth metal salts thereof also are useful antioxidants.

Preferred antioxidants also include hindered phenols, arylamines. These antioxidants may be used individually by type or in combination with one another. Such additives may be used in an amount of 0.01 to 5 weight percent, preferably 0.01 to 1.5 weight percent, more preferably zero to less than 1.5 weight percent, more preferably zero to less than 1 weight percent.

Pour Point Depressants (PPDs)

Conventional pour point depressants (also known as lube oil flow improvers) may be added to the compositions of the present disclosure if desired. These pour point depressant may be added to lubricating compositions of the present disclosure to lower the minimum temperature at which the fluid will flow or can be poured. Examples of suitable pour point depressants include polymethacrylates, polyacrylates, polyarylamides, condensation products of haloparaffin waxes and aromatic compounds, vinyl carboxylate polymers, and terpolymers of dialkylfumarates, vinyl esters of fatty acids and allyl vinyl ethers. U.S. Pat. Nos. 1,815,022; 2,015,748; 2,191,498; 2,387,501; 2,655,479; 2,666,746; 2,721,877; 2,721,878; and 3,250,715 describe useful pour point depressants and/or the preparation thereof. Such additives may be used in an amount of about 0.01 to 5 weight percent, preferably about 0.01 to 1.5 weight percent.

Seal Compatibility Agents

Seal compatibility agents help to swell elastomeric seals by causing a chemical reaction in the fluid or physical change in the elastomer. Suitable seal compatibility agents for lubricating oils include organic phosphates, aromatic esters, aromatic hydrocarbons, esters (butylbenzyl phthalate, for example), and polybutenyl succinic anhydride. Such additives may be used in an amount of about 0.01 to 3 weight percent, preferably about 0.01 to 2 weight percent.

Antifoam Agents

Anti-foam agents may advantageously be added to lubricant compositions. These agents retard the formation of stable foams. Silicones and organic polymers are typical anti-foam agents. For example, polysiloxanes, such as silicon oil or polydimethyl siloxane, provide antifoam properties. Anti-foam agents are commercially available and may be used in conventional minor amounts along with other additives such as demulsifiers; usually the amount of these additives combined is less than 1 weight percent and often less than 0.1 weight percent.

Inhibitors and Antirust Additives

Antirust additives (or corrosion inhibitors) are additives that protect lubricated metal surfaces against chemical attack by water or other contaminants. A wide variety of these are commercially available.

One type of antirust additive is a polar compound that wets the metal surface preferentially, protecting it with a film of oil. Another type of antirust additive absorbs water by incorporating it in a water-in-oil emulsion so that only the oil touches the metal surface. Yet another type of antirust additive chemically adheres to the metal to produce a non-reactive surface. Examples of suitable additives include zinc dithiophosphates, metal phenolates, basic metal sulfonates, fatty acids and amines. Such additives may be used in an amount of about 0.01 to 5 weight percent, preferably about 0.01 to 1.5 weight percent.

Friction Modifiers

A friction modifier is any material or materials that can alter the coefficient of friction of a surface lubricated by any lubricant or fluid containing such material(s). Friction modifiers, also known as friction reducers, or lubricity agents or oiliness agents, and other such agents that change the ability of base oils, formulated lubricant compositions, or functional fluids, to modify the coefficient of friction of a lubricated surface may be effectively used in combination with the base oils or lubricant compositions of the present disclosure if desired. Friction modifiers that lower the coefficient of friction are particularly advantageous in combination with the base oils and lube compositions of this disclosure.

Illustrative friction modifiers may include, for example, organometallic compounds or materials, or mixtures thereof. Illustrative organometallic friction modifiers useful in the lubricating engine oil formulations of this disclosure include, for example, molybdenum amine, molybdenum diamine, an organotungstenate, a molybdenum dithiocarbamate, molybdenum dithiophosphates, molybdenum amine complexes, molybdenum carboxylates, and the like, and mixtures thereof. Similar tungsten based compounds may be preferable.

Other illustrative friction modifiers useful in the lubricating engine oil formulations of this disclosure include, for example, alkoxylated fatty acid esters, alkanolamides, polyol fatty acid esters, borated glycerol fatty acid esters, fatty alcohol ethers, and mixtures thereof.

Illustrative alkoxylated fatty acid esters include, for example, polyoxyethylene stearate, fatty acid polyglycol ester, and the like. These can include polyoxypropylene stearate, polyoxybutylene stearate, polyoxyethylene isosterate, polyoxypropylene isostearate, polyoxyethylene palmitate, and the like.

Illustrative alkanolamides include, for example, lauric acid diethylalkanolamide, palmic acid diethylalkanolamide, and the like. These can include oleic acid diethyalkanolamide, stearic acid diethylalkanolamide, oleic acid diethylalkanolamide, polyethoxylated hydrocarbylamides, polypropoxylated hydrocarbylamides, and the like.

Illustrative polyol fatty acid esters include, for example, glycerol mono-oleate, saturated mono-, di-, and tri-glyceride esters, glycerol mono-stearate, and the like. These can include polyol esters, hydroxyl-containing polyol esters, and the like.

Illustrative borated glycerol fatty acid esters include, for example, borated glycerol mono-oleate, borated saturated mono-, di-, and tri-glyceride esters, borated glycerol monosterate, and the like. In addition to glycerol polyols, these can include trimethylolpropane, pentaerythritol, sorbitan, and the like. These esters can be polyol monocarboxylate esters, polyol dicarboxylate esters, and on occasion polyol-tricarboxylate esters. Preferred can be the glycerol mono-oleates, glycerol dioleates, glycerol trioleates, glycerol monostearates, glycerol distearates, and glycerol tristearates and the corresponding glycerol monopalmitates, glycerol dipalmitates, and glycerol tripalmitates, and the respective isostearates, linoleates, and the like. On occasion the glycerol esters can be preferred as well as mixtures containing any of these. Ethoxylated, propoxylated, butoxylated fatty acid esters of polyols, especially using glycerol as underlying polyol can be preferred.

Illustrative fatty alcohol ethers include, for example, stearyl ether, myristyl ether, and the like. Alcohols, including those that have carbon numbers from C3 to C5, can be ethoxylated, propoxylate, or butoxylated to form the corresponding fatty alkyl ethers. The underlying alcohol portion can preferably be stearyl, myristyl, C11-C13 hydrocarbon, oleyl, isosteryl, and the like.

Useful concentrations of friction modifiers may range from 0.01 weight percent to 5 weight percent, or about 0.1 weight percent to about 2.5 weight percent, or about 0.1 weight percent to about 1.5 weight percent, or about 0.1 weight percent to about 1 weight percent. Concentrations of molybdenum-containing materials are often described in terms of Mo metal concentration. Advantageous concentrations of Mo may range from 25 ppm to 2000 ppm or more, and often with a preferred range of 50-1500 ppm. Friction modifiers of all types may be used alone or in mixtures with the materials of this disclosure. Often mixtures of two or more friction modifiers, or mixtures of friction modifier(s) with alternate surface active material(s), are also desirable.

When lubricating oil compositions contain one or more of the additives discussed above, the additive(s) are blended into the composition in an amount sufficient for it to perform its intended function. Typical amounts of such additives useful in the present disclosure are shown in Table 1 below.

It is noted that many of the additives are shipped from the additive manufacturer as a concentrate, containing one or more additives together, with a certain amount of base oil diluents. Accordingly, the weight amounts in the table below, as well as other amounts mentioned herein, are directed to the amount of active ingredient (that is the non-diluent portion of the ingredient). The weight percent (wt %) indicated below is based on the total weight of the lubricating oil composition.

TABLE 1

Typical Amounts of Other Lubricating Oil Components

| Compound | Approximate wt % (Useful) | Approximate wt % (Preferred) |
|---|---|---|
| Dispersant | 0.1-20 | 0.1-8 |
| Detergent | 0.1-20 | 0.1-8 |
| Friction Modifier | 0.01-5 | 0.01-1.5 |
| Antioxidant | 0.1-5 | 0.1-1.5 |
| Pour Point Depressant (PPD) | 0.0-5 | 0.01-1.5 |
| Anti-foam Agent | 0.001-3 | 0.001-0.15 |
| Viscosity Index Improver (pure polymer basis) | 0.0-8 | 0.1-6 |
| Anti-wear | 0.1-2 | 0.5-1 |
| Inhibitor and Antirust | 0.01-5 | 0.01-1.5 |

The foregoing additives are all commercially available materials. These additives may be added independently but are usually precombined in packages which can be obtained from suppliers of lubricant oil additives. Additive packages with a variety of ingredients, proportions and characteristics are available and selection of the appropriate package will take the requisite use of the ultimate composition into account.

The following non-limiting examples are provided to illustrate the disclosure.

EXAMPLES

Example 1

A Ford Ecoboost 2.01 L engine was used to conduct low speed pre-ignition (LSPI) experiments using the engine type and engine operating conditions shown in Table 2 below.

TABLE 2

Engine and Operating Conditions

|  | Ford EcoBoost 2.0 L |
|---|---|
| Manufacturer | Ford |
| Enginetype | 2.0 L Ti-VCT GTDI I-4 |
| Year | 2013 |
| Enginetype | 4-Cylinder, I-4 |

TABLE 2-continued

Engine and Operating Conditions

Ford EcoBoost 2.0 L

| Combustion Process | SI-DI, 7-hole-solenoid-injector |
| --- | --- |
| Aspiration | Turbocharged |
| Firing order | 1-3-4-2 |
| Fueltype | RON95 |
| side/central DI | Side |
| Displacement | 1.999 dm$^3$ |
| Bore | 87.5 mm |
| Stroke | 83.1 mm |
| s/D | 0.95 |
| Compression Ratio | 9.3:1 |
| Power Output | 240 hp/179 kW |
| Specific Power | 89.5 kW/dm$^3$ |
| max. Engine Speed | |
| max. Injection Pressure | 150 bar |
| Max. Torque | 360 Nm/270 lb.-ft. |
| Specific Torque | 180 Nm/dm$^3$ |
| Valve Train | DOHC, 4 Valves/Cylinder, chain-driven camshafts, w/o HLA |
| Intake System, Supercharging | Borg Warner K03 Turbocharger, plastic intake manifold |
| Exhaust System, Aftertreatment | integrated exhaust manifold, hot-end 3-Way-TWC, premuffler, rear muffler |

The Ford EcoBoost GTDI engine is a turbocharged 2.0l 4-cylinder engine from a 2013 Ford Fusion. The engine is based on the Duratec engine family and is a 4 valve-per-cylinder, dual overhead Camshaft engine with continuous dual VVT. Both cylinder head and block are made of aluminum with the bearing caps integrated into the ladder assembly. The camshafts are mounted in the cylinder head and act against valve tappets to open and close the valves. The camshafts are driven off the front of the cylinder head by one timing chain. The engine features a mass balancing module and direct injection (7 hole solenoid side injectors). The engine is turbo charged (intercooled) and has an integrated exhaust manifold.

Water cooled cylinder pressure indication (Kistler 6041A) is installed on all four cylinders. In addition, cylinder 1 features low pressure indication in the intake runner (Kistler 4005BA5FA0).

The following measures to characterize engine knock were used:
Knock peak to peak is defined as the maximum amplitude of the band-pass filtered pressure signal.

Knock intensity is defined as the integrated value of the rectified, band-pass filtered pressure signal. The integration limits are set through the knock window.

Magaknock event after pre ignition is defined as a knock amplitude higher than (engine speed/1000)*1.5.
Pre-Ignition Investigation Procedure:
1. Removal of Oil Control Rings in Cylinders 1 and 3
2. Spark sweep comparison of four engine oils and clean engine with test fuel.
3. Measurement of 5000 engine cycles per measurement point. 16 measurement points are analyzed per test run (80000 combustion cycles)
Engine Settings Used:
  Engine Speed: 2000 rpm
  Load: 1.8 bar boost pressure
  Fuel Enrichment: 1.00 (closed loop)
  Start of Injection: 315degCAbTDC
  Fuel Rail Pressure: 155 bar
  Intake Valve Phasing: 15degCA
  Exhaust Valve Phasing: 0degCA
  SparkTiming: 1degCAaTDC
Boundary Settings Used:
  Coolant Temp.: 100° C.
  Oil Gallery bmp.: 100° C.
  Intake Temp.: 50° C.
  Inlet Press.: 1000 mbar
  Humidity: 47 gr/lbs
  Tailpipe Press.: 1000 mbar Oil consumption level before the removal of the oil control rings in Cylinders 1 and 3 were approximately 4 grams per hour. After the removal of the oil control rings in Cylinders Piston 1 and 3, the oil consumption increased to approximately 157 to 208 grams per hour.

TABLE 3

Oil Formulations Tested

|  | 15-083944 Oil A | 15-059979 Oil B | 15-066285 Oil C |
| --- | --- | --- | --- |
| Base Oil | 72.69 | | |
| Base Oil 2, Alkylated Naphthalene | 6.95 | | |
| Base Oil 3 | | 84.83 | |
| Base Oil 4, Lubricit iC9-9-DF | | | 90.5 |
| High Molecular Weight Polyalphaolefin | 5 | | |
| Viscosity Modifier SV300 | | | 2.5 |
| Viscosity Modifier SV140 | 1.04 | | |
| Antioxidant ETHANOX 4710 | 0.75 | 0.75 | |
| Antifoam Additive #1 | 0.75 | 0.75 | |
| Antifoam Additive #2 | | | 0.2 |
| QUINIZARIN | | 0.02 | |
| Arlamol E (Arlamol PS15E-LQ-AP) | | 0.95 | |
| VISCOPLEX 10-617, polymethacrylate dispersant | | 1.6 | |
| IRGANOX L 135 | | 0.25 | |
| Amine phosphate | | 0.25 | |
| Organic Friction Modifier #1 | 0.55 | 0.5 | |
| Organic Friction Modifier #2 | | | 1 |
| Dithiophosphate | | 0.1 | |
| NYCO NYCOPERF AO 337 | | 10 | |
| Dipheny lamine | 0.75 | | 0.6 |
| Molybdenum Dithiocarbamate | 2.54 | | |
| Molybednum Dithiophosphate | | | 1.9 |
| Mixture of Dispersant | 4.55 | | |
| Mixture of Cacium Salicylates | 1.5 | | |
| Magnesium Sulfonate | 0.83 | | |
| Seconardy Zin dialkyldithiophosphate | | | 1.3 |
| Mixture of Primary and Secondary Zinc Dialkyldithiophostate | 2.1 | | |
| Borate Ester | | | 0.8 |
| Mixture of borated and non-borate Calcium Sulfonate | | | 1.2 |

Oils A, B and C are inventive oil formulations.

TABLE 4

Properties of Formulated Lubricants

|  | 15-083944 Oil A | 15-059979 Oil B | 15-066285 Oil C |
| --- | --- | --- | --- |
| D445-Kinematic Viscosity, 40 C., MM2/S | 71.61 | 124.4 | 57.4 |
| D445 Kinematic Viscosity, 100 C., MM2/S | 13.35 | 12.69 | 15.74 |

TABLE 4-continued

Properties of Formulated Lubricants

|  | 15-083944 Oil A | 15-059979 Oil B | 15-066285 Oil C |
|---|---|---|---|
| D445 Kinematic Viscosity at 150 C., MM2/S | 6.07 | 4.61 | 6.13 |
| D4683 Apparent Viscosity, CP | 3.24 | 3.88 | 3.23 |
| D4951 BORON, MASS % | 0.01 | <0.001 | 0.029 |
| D4951 BARIUM, MASS % | <0.001 | <0.001 | <0.001 |
| D4951 CALCIUM, MASS % | 0.12 | <0.001 | 0.126 |
| D4951 MAGNESIUM, MASS % | 0.08 | 0.001 | 0.001 |
| D4951 MOLYBDENUM, MASS % | 0.14 | <0.001 | 0.176 |
| D4951 PHOSPHORUS, MASS % | 0.183 | 0.015 | 0.198 |
| D4951 ZINC, MASS % | 0.195 | <0.001 | 0.14 |
| D6443 SULFUR, MASS % | 0.61 | 0.058 | 0.422 |
| D874 Sulfated Ash, MASS % | 1.16 | | |

TABLE 5

Pre Ignition Data of Oil A (Average Oil Consumption 207.8 grams per hour).

|  | No. of first Pre Ignition (PI) | No. of Folowing Pre Ignition | No. of PI Cycles with Mega-knock | No. of PI Cycles >100 Bar |
|---|---|---|---|---|
| Total | 139 | 158 | 10 | 15 |
| Cylinder 1 | 17 | 0 | | |
| Cylinder 2 | 29 | 0 | | |
| Cylinder 3 | 86 | 158 | 10 | 15 |
| Cylinder 4 | 7 | 0 | | |

TABLE 6

Pre Ignition Data of Oil B (Average Oil Consumption 163.9 grams per hour)

|  | No. of first Pre Ignition (PI) | No. of Folowing Pre Ignition | No. of PI Cycles with Mega-knock | No. of PI Cycles >100 Bar |
|---|---|---|---|---|
| Total | 100 | 30 | | 1 |
| Cylinder 1 | 8 | 0 | | |
| Cylinder 2 | 17 | 0 | | 1 |
| Cylinder 3 | 4 | 30 | | |
| Cylinder 4 | 71 | 0 | | |

TABLE 7

Pre Ignition Data of Oil C (Average Oil Consumption 156.6 grams per hour)

|  | No. of first Pre Ignition (PI) | No. of Folowing Pre Ignition | No. of PI Cycles with Mega-knock | No. of PI Cycles >100 Bar |
|---|---|---|---|---|
| Total | 31 | 48 | 1 | 1 |
| Cylinder 1 | 6 | 9 | | |
| Cylinder 2 | 2 | 0 | | |
| Cylinder 3 | 14 | 39 | 1 | 1 |
| Cylinder 4 | 9 | 0 | | |

TABLE 8

Repeat Pre Ignition Data of Oil A (Average Oil Consumption 182.0 grams per hour)

|  | No. of first Pre Ignition (PI) | No. of Folowing Pre Ignition | No. of PI Cycles with Mega-knock | No. of PI Cycles >100 Bar |
|---|---|---|---|---|
| Total | 61 | 154 | 4 | 4 |
| Cylinder 1 | 4 | 0 | | |
| Cylinder 2 | 7 | 0 | | |
| Cylinder 3 | 27 | 154 | 4 | 3 |
| Cylinder 4 | 23 | 0 | | 1 |

Base Oil 1 is a 4 cSt polyalphaolefin, Base Oil 2 is a cSt Alkylated Naphthalene, Base Oil 3 is a monopentaerythritol ester of branched acids (See Table 9 for carbon distribution), and Base Oil 4 is 3,5,5-trimethylhexyl 3,5,5-trimethylhexanoate.

TABLE 9

Carbon distribution of Base Oil 3

|  | Base Oil 3 Monopentaerythritol ester of branched acids |
|---|---|
| Quanternery C, mole %* | 21% |
| CH, mole %* | 2% |
| CH2, mole %* | 35% |
| CH3, mole %* | 42% |

*Determined by Carbon-13 NMR

In the present example, Oil A has an X factor of −5.2, as defined in Equation 1, high LSPI events were observed when the oil controlled rings (OCRs) for Cylinder 1 and 3 were removed (resulting in high oil consumption) even though one skilled in the art would expect this lubricating engine oil would have good LSPI performance in an engine with low or normal oil consumption. It was also found that in this example that these LSPI events can be reduced with engine oils formulated with special base oils and ashless additives (Oils B and C).

PCT and EP Clauses:

1. A method for preventing or reducing engine knock or pre-ignition in a high compression spark ignition engine lubricated with a lubricating oil by using as the lubricating oil a formulated oil, said formulated oil having a composition comprising (i) a lubricating oil base stock comprising at least one ester including at least one group selected from the group consisting of Formula (1), Formula (2), Formula (3) and Formula (4) below or or at least one ester having at least 25% of its carbons in the form of methyl groups:

$$(CH_3)_2CHCH_2— \quad (1)$$

$$(CH_3)_3CCH_2— \quad (2)$$

$$(CH_3)_3CCH_2CH(CH_3)CH_2CH_2— \quad (3)$$

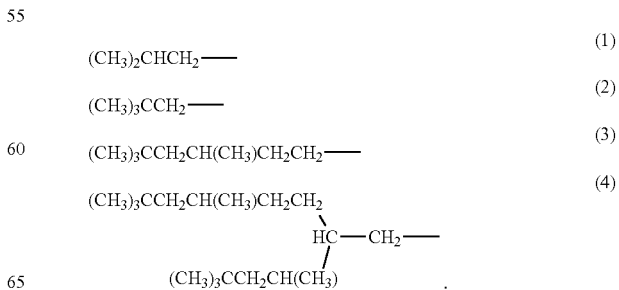

(4)

2. The method of clause 1 wherein the at least one ester is a polyol ester

3. The method of clause 1 wherein the at least one ester is a monoester or dibasic ester.

4. The method of clauses 1-3 wherein the at least one ester has at least 33% of its carbons in the form of methyl groups.

5. The method of clauses 1-4 wherein the formulated oil is an ashless formulated oil.

6. The method of clauses 1-5 wherein the formulated oil further includes at least one ashless antiwear additive selected from the group consisting of an amine phosphate, a thiophosphate, a dithiophosphate, an amine salt of sulfurized phosphate, an alkylated to triphenylphosphorothionate, and mixtures thereof.

7. The method of clauses 1-6 wherein the formulated oil further comprises an aminic antioxidant.

8. The method of clauses 1-7 wherein the formulated oil further comprises a polymeric aminic antioxidant.

9. The method of clause 6 wherein the at least one ester is present in an amount of from 1 to 99.8 weight percent, based on the total weight of the formulated oil, and the at least one ashless antiwear additive is present in an amount from 0.1 to 4 weight percent, based on the total weight of the formulated oil.

10. The method of clauses 1-9 wherein the lubricating oil further comprises one or more of a detergent, dispersant, viscosity index improver, antioxidant, pour point depressant, corrosion inhibitor, metal deactivator, seal compatibility additive, anti-foam agent, inhibitor, anti-rust additive, and friction modifier.

11. The method of clause 10 wherein the detergent is an ashless nonionic detergent.

12. The method of clauses 1-11 wherein the high compression spark ignition engine with relatively high oil consumption has a compression ratio of at least 12.

13. The method of clauses 1-12 wherein the high compression spark ignition ignition engine with relatively high oil consumption is a super-charged engine or a turbo-charged engine.

14. The method of clauses 1-13 wherein the high compression spark ignition engine with relatively high oil consumption is a high compression spark ignition engine with an oil consumption greater than 50 grams per hour.

15. The method of clauses 1-14 wherein the pre-ignition is low speed pre-ignition (LSPI).

16. The method of clause 2 wherein the polyol ester is derived from at least one polyhydric alcohol and at least one branched mono-carboxylic acid.

17. The method of clause 16 wherein the polyhydric alcohol is selected from the group consisting of neopentyl glycol, 2,2-dimethylol butane, trimethylol ethane, trimethylol propane, trimethylol butane, mono-pentaerythritol, di-pentaerythritol, tri-pentaerythritol, ethylene glycol, propylene glycol and polyalkylene glycols, and mixtures thereof.

18. A lubricating engine oil for high compression spark ignition engines having a composition comprising a lubricating oil base stock comprising at least one ester including at least one group selected from the group consisting of Formula (1), Formula (2), and Formula (3) and Formula (4) below or or at least one ester having at least 25% of its carbons in the form of methyl groups:

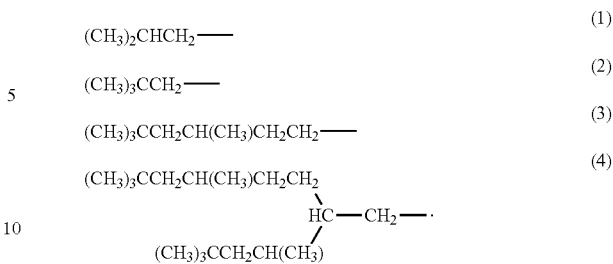

19. The lubricating engine oil of clause 18 wherein the one ester is a polyol ester 20. The lubricating engine oil of clauses 18-19 wherein the one ester is a monoester or dibasic ester.

21. The lubricating engine oil of clauses 18-20 wherein the oil further includes at least one ashless antiwear additive selected from the group consisting of an amine phosphate, a thiophosphate, a dithiophosphate, an amine salt of sulfurized phosphate, an alkylated triphenylphosphorothionate, and mixtures thereof.

22. The lubricating engine oil of clauses 18-21 wherein the oil further comprises an aminic antioxidant.

23. The lubricating engine oil of clauses 18-22 wherein the at least one ester is present in an amount of from 1 to 99.8 weight percent, based on the total weight of the oil, and the at least one ashless antiwear additive is present in an amount from 0.1 to 4 weight percent, based on the total weight of the oil.

24. The lubricating engine oil of clauses 18-23 wherein the lubricating oil further comprises one or more of a detergent, dispersant, viscosity index improver, antioxidant, pour point depressant, corrosion inhibitor, metal deactivator, seal compatibility additive, anti-foam agent, inhibitor, anti-rust additive, and friction modifier.

All patents and patent applications, test procedures (such as ASTM methods, UL methods, and the like), and other documents cited herein are fully incorporated by reference to the extent such disclosure is not inconsistent with this disclosure and for all jurisdictions in which such incorporation is permitted.

When numerical lower limits and numerical upper limits are listed herein, ranges from any lower limit to any upper limit are contemplated. While the illustrative embodiments of the disclosure have been described with particularity, it will be understood that various other modifications will be apparent to and can be readily made by those skilled in the art without departing from the spirit and scope of the disclosure. Accordingly, it is not intended that the scope of the claims appended hereto be limited to the examples and descriptions set forth herein but rather that the claims be construed as encompassing all the features of patentable novelty which reside in the present disclosure, including all features which would be treated as equivalents thereof by those skilled in the art to which the disclosure pertains.

The present disclosure has been described above with reference to numerous embodiments and specific examples. Many variations will suggest themselves to those skilled in this art in light of the above detailed description. All such obvious variations are within the full intended scope of the appended claims.

The invention claimed is:

1. A method for preventing or reducing engine knock or pre-ignition in a high compression spark ignition engine, comprising:
introducing a formulated oil to the engine, said formulated oil having a composition comprising a lubricating oil base stock comprising: (a) at least one ester including at least one group selected from the group consisting of: Formula (1), Formula (2), Formula (3) and Formula (4) below; or (b) at least one ester having at least 25% of its carbons in the form of methyl groups:

 (1)

 (2)

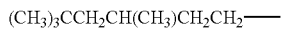 (3)

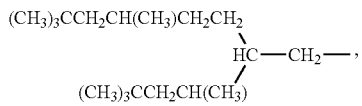 (4)

and
operating the engine at an oil consumption rate greater than 50 grams per hour.

2. The method of claim 1 wherein the at least one ester is a polyol ester.

3. The method of claim 1 wherein the at least one ester is a monoester or dibasic ester.

4. The method of claim 1 wherein the at least one ester has at least 33% of its carbons in the form of methyl groups.

5. The method of claim 1 wherein the formulated oil is an ashless formulated oil.

6. The method of claim 1 wherein the formulated oil further includes at least one ashless antiwear additive selected from the group consisting of an amine phosphate, a thiophosphate, a dithiophosphate, an amine salt of sulfurized phosphate, an alkylated triphenylphosphorothionate, and mixtures thereof.

7. The method of claim 1 wherein the formulated oil further comprises an aminic antioxidant.

8. The method of claim 1 wherein the formulated oil further comprises a polymeric or oligomeric aminic antioxidant.

9. The method of claim 6 wherein the at least one ester is present in an amount of from 1 to 99.8 weight percent, based on the total weight of the formulated oil, and the at least one ashless antiwear additive is present in an amount from 0.1 to 4 weight percent, based on the total weight of the formulated oil.

10. The method of claim 1 wherein the lubricating oil further comprises one or more of a detergent, dispersant, viscosity index improver, antioxidant, pour point depressant, corrosion inhibitor, metal deactivator, seal compatibility additive, anti-foam agent, inhibitor, anti-rust additive, or friction modifier.

11. The method of claim 10 wherein the detergent is an ashless nonionic detergent.

12. The method of claim 1 wherein the ignition engine has a compression ratio of at least 12.

13. The method of claim 1 wherein the ignition engine is a super-charged engine or a turbo-charged engine.

14. The method of claim 1 wherein the pre-ignition is low speed pre-ignition (LSPI).

15. The method of claim 2 wherein the polyol ester is derived from at least one polyhydric alcohol and at least one branched mono-carboxylic acid.

16. The method of claim 15 wherein the polyhydric alcohol is selected from the group consisting of neopentyl glycol, 2,2-dimethylol butane, trimethylol ethane, trimethylol propane, trimethylol butane, mono-pentaerythritol, di-pentaerythritol, tri-pentaerythritol, ethylene glycol, propylene glycol and polyalkylene glycols, and mixtures thereof.

17. A lubricating engine oil for preventing or reducing engine knock or pre-ignition in a high compression spark ignition engine, comprising:
0.05 wt % to 0.6 wt % calcium; and
a lubricating oil base stock comprising: (a) at least one ester including at least one group selected from the group consisting of: Formula (1), Formula (2), Formula (3), and Formula (4) below; or (b) at least one ester having at least 25% of its carbons in the form of methyl groups:

 (1)

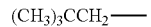 (2)

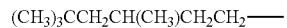 (3)

 (4)

18. The lubricating engine oil of claim 17 wherein the lubricating engine oil is ashless lubricating engine oil.

19. The lubricating engine oil of claim 17 wherein the at least one ester is a polyol ester.

20. The lubricating engine oil of claim 17 wherein the at least one ester is a monoester or dibasic ester.

21. The lubricating engine oil of claim 15 wherein the at least one ester has at least 33% of its carbons in the form of methyl groups.

22. The lubricating engine oil of claim 17 further including at least one ashless antiwear additive selected from the group consisting of an amine phosphate, a thiophosphate, a dithiophosphate, an amine salt of sulfurized phosphate, an alkylated triphenylphosphorothionate, and mixtures thereof.

23. The lubricating engine oil of claim 17 further comprising an aminic antioxidant.

24. The lubricating engine oil of claim 17 further comprising a polymeric or oligomeric aminic antioxidant.

25. The lubricating engine oil of claim 22 wherein the at least one ester is present in an amount of from 1 to 99.8 weight percent, based on the total weight of the oil, and the at least one ashless antiwear additive is present in an amount from 0.1 to 4 weight percent, based on the total weight of the oil.

26. The lubricating engine oil of claim 17 which further comprises one or more of a detergent, dispersant, viscosity index improver, antioxidant, pour point depressant, corrosion inhibitor, metal deactivator, seal compatibility additive, anti-foam agent, inhibitor, anti-rust additive, and friction modifier.

27. The lubricating engine oil of claim 26 wherein the detergent is an ashless nonionic detergent.

28. The lubricating engine oil of claim 17 wherein the engine has a compression ratio of at least 12.

29. The lubricating engine oil of claim 17 wherein the engine is a super-charged engine or a turbo-charged engine.

30. The lubricating engine oil of claim 17 wherein the engine has an oil consumption greater than 50 grams per hour.

31. The lubricating engine oil of claim 17 wherein the pre-ignition is low speed pre-ignition (LSPI).

32. The lubricating engine oil of claim 19 wherein the polyol ester is derived from at least one polyhydric alcohol and at least one branched mono-carboxylic acid.

33. The lubricating engine oil of claim 32 wherein the polyhydric alcohol is selected from the group consisting of neopentyl glycol, 2,2-dimethylol butane, trimethylol ethane, trimethylol propane, trimethylol butane, mono-pentaerythritol, pentaerythritol, di-pentaerythritol, tri-pentaerythritol, ethylene glycol, propylene glycol and polyalkylene glycols, and mixtures thereof.

34. A high compression spark ignition engine lubricated with the lubricating engine oil of claim 17.

35. A method of making a lubricating engine oil for high compression spark ignition engines with relatively high oil consumption, said method comprising:

blending a lubricating oil base stock comprising:
(i) at least one ester including at least one group selected from the group consisting of Formula (1), Formula (2), Formula (3) and Formula (4) below:

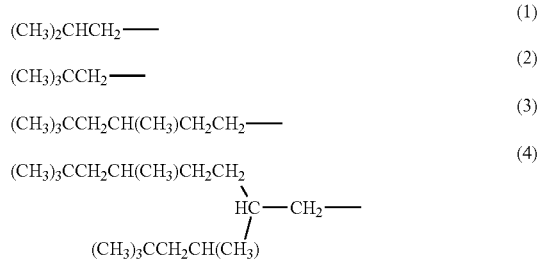

or (ii) at least one ester having at least 25% of its carbon in the form of methyl group and (iii) at least one ashless antiwear additive selected from the group consisting of a phosphorus-containing ashless antiwear additive, a sulfur-containing ashless antiwear additive, and a phosphorus/sulfur-containing ashless antiwear additive to form the lubricating engine oil, wherein the engine oil comprises 0.05 wt % to 0.6 wt % calcium.

36. A method for preventing or reducing engine knock or pre-ignition in a high compression spark ignition engine, comprising:

introducing a formulated oil to the engine, said formulated oil having a composition comprising:
(i) a lubricating oil base stock comprising: (a) at least one ester including at least one group selected from the group consisting of: Formula (1), Formula (2), Formula (3) and Formula (4) below; or (b) at least one ester having at least 33% of its carbons in the form of methyl groups:

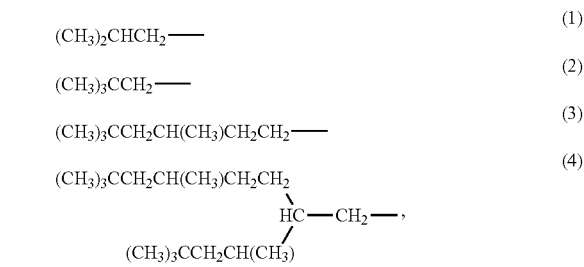

and (ii) at least one ashless antiwear additive selected from the group consisting of an amine phosphate, a thiophosphate, a dithiophosphate, an amine salt of sulfurized phosphate, an alkylate phosphorothionate, and mixtures thereof; and operating the engine at an oil consumption rate greater than 50 grams per hour.

37. The method of claim 36 wherein the formulated oil further comprises polymeric or oligomeric amines that are polymerization reaction products of one or more substituted or hydrocarbyl-substituted diphenyl amines, one or more unsubstituted or hydrocarbyl-substituted phenyl naphthyl amines, or both one or more of unsubstituted or hydrocarbyl-substituted diphenylamine with one or more unsubstituted or hydrocarbyl-substituted phenyl naphthylamine.

38. A lubricating engine oil for preventing or reducing engine knock or pre-ignition in a high compression spark ignition engine with oil consumption higher than 50 grams per hour the oil comprising:
(i) a lubricating oil base stock comprising: (a) at least one ester including at least one group selected from the group consisting of: Formula (1), Formula (2), Formula (3) and Formula (4) below; or (b) at least one ester having at least 33% of its carbons in the form of methyl groups:

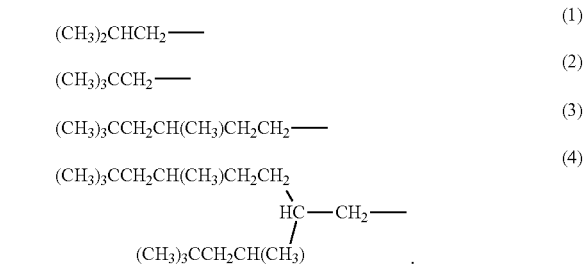

(ii) at least one ashless antiwear additive selected from the group consisting of an amine phosphate, a thiophosphate, a dithiophosphate, an amine salt of sulfurized phosphate, an alkylated phosphorothionate, or mixtures thereof, and (iii) 0.05 wt % to 0.6 wt % calcium.

39. The lubricating engine oil of claim 38 further comprising an alkylated phenyl naphthylamine antioxidant.

* * * * *